United States Patent
Park

(10) Patent No.: US 11,825,596 B2
(45) Date of Patent: Nov. 21, 2023

(54) STORAGE DEVICES AND METHODS OF OPERATING STORAGE DEVICES

(71) Applicant: SAMSUNG ELECTRONICS CO., LTD., Suwon-si (KR)

(72) Inventor: Jiwoon Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 359 days.

(21) Appl. No.: 17/167,209

(22) Filed: Feb. 4, 2021

(65) Prior Publication Data

US 2022/0046789 A1 Feb. 10, 2022

(30) Foreign Application Priority Data

Aug. 10, 2020 (KR) .......................... 10-2020-0099602

(51) Int. Cl.
| | |
|---|---|
| H05K 1/00 | (2006.01) |
| H05K 1/02 | (2006.01) |
| H03H 7/06 | (2006.01) |
| H05K 1/11 | (2006.01) |

(52) U.S. Cl.
CPC ............. *H05K 1/0233* (2013.01); *H03H 7/06* (2013.01); *H05K 1/112* (2013.01); *H05K 2201/094* (2013.01); *H05K 2201/10159* (2013.01)

(58) Field of Classification Search
CPC ................. H05K 1/0233; H05K 1/112; H05K 2201/094; H05K 2201/10159; H03H 7/06
See application file for complete search history.

(56) References Cited

U.S. PATENT DOCUMENTS

| | | | |
|---|---|---|---|
| 8,737,459 B2 | 5/2014 | Sawey et al. | |
| 8,964,818 B2 | 2/2015 | Longo et al. | |
| 9,143,369 B2 | 9/2015 | He et al. | |
| 9,742,602 B2 | 8/2017 | Zerbe et al. | |
| RE46,887 E * | 6/2018 | Yoon .................. | G11C 16/0483 |
| 10,404,236 B2 | 9/2019 | Zerbe et al. | |
| 10,586,775 B2 | 3/2020 | Kim et al. | |
| 2009/0276546 A1 | 11/2009 | Lui et al. | |

(Continued)

FOREIGN PATENT DOCUMENTS

| | | |
|---|---|---|
| KR | 10-1503609 B1 | 3/2015 |
| WO | 2011/076259 A1 | 6/2011 |

OTHER PUBLICATIONS

KR 20160019596 A English Translation; published on Feb. 22, 2016 (Year: 2016).*

(Continued)

*Primary Examiner* — Pete T Lee
(74) *Attorney, Agent, or Firm* — Sughrue Mion, PLLC

(57) ABSTRACT

A storage device is provided. The storage device includes nonvolatile memory devices provided on a printed circuit board (PCB), a connector, a storage controller and at least one first passive filter. The connector is provided in the PCB and includes connection terminals. The storage controller is provided on the PCB, communicates with an external host through the connection terminals and controls the nonvolatile memory devices. The at least one first passive filter is provided in the PCB, is connected between the connector and the storage controller, and performs an equalization on either a signal provided to the storage controller or a signal provided from the storage controller.

19 Claims, 20 Drawing Sheets

(56) References Cited

U.S. PATENT DOCUMENTS

| | | | |
|---|---|---|---|
| 2014/0159769 A1 | 6/2014 | Hong et al. | |
| 2015/0049849 A1* | 2/2015 | Chen | H03L 7/00 |
| | | | 375/376 |
| 2017/0154682 A1 | 6/2017 | Moon et al. | |
| 2018/0004281 A1 | 1/2018 | Kang et al. | |
| 2018/0018294 A1 | 1/2018 | Park et al. | |
| 2018/0308532 A1* | 10/2018 | Roh | G11C 29/023 |
| 2019/0179553 A1 | 6/2019 | Kim et al. | |
| 2019/0227611 A1 | 7/2019 | Nam et al. | |
| 2019/0379357 A1* | 12/2019 | Kang | H03H 17/06 |
| 2020/0036563 A1 | 1/2020 | Talbot et al. | |
| 2020/0185013 A1 | 6/2020 | Chang | |

OTHER PUBLICATIONS

Communication dated Oct. 8, 2021 by the European Patent Office in counterpart European Patent Application No. 21170296.4.

* cited by examiner

FIG. 6

| | | | |
|---|---|---|---|
| 74 | N/C(or 3.3V) | 75 | GND |
| 72 | N/C(or 3.3V) | 73 | GND |
| 70 | N/C(or 3.3V) | 71 | GND |
| 68 | SUSCLK(32kHz) | 69 | PEDET | N/C |
| 66 | //// | 67 | |
| 64 | //// | 65 | //// |
| 62 | //// | 63 | //// |
| 60 | //// | 61 | //// |
| 58 | Reserved MFG_CLOCK | 59 | //// |
| 56 | Reserved MFG_DATA | 57 | GND |
| 54 | N/C | PEWAKE# | 55 | N/C | REFCLKp |
| 52 | N/C | CLKREQ# | 53 | N/C | REFCLKn |
| 50 | N/C | PERST#0 | 51 | GND |
| 48 | | 49 | SATA-A+ | PERp0 |
| 46 | | 47 | SATA-A− | PERn0 |
| 44 | N/C | ALERT#(0) | 45 | GND |
| 42 | SMB_DATA(I/O)(0/1.8V) | 43 | SATA-B+ | PERp1 |
| 40 | SMB_CLK(I/O)(0/1.8V) | 41 | SATA-B− | PERn0 |
| 38 | DEVSLP/PWDIS | NC | 39 | GND |
| 36 | 12V(Pre-Charge)(or N/C) | 37 | N/C | PERp1 |
| 34 | 12V(or N/C) | 35 | N/C | PERn1 |
| 32 | 12V(or N/C) | 33 | GND |
| 30 | 12V(or N/C) | 31 | N/C | PETp1 |
| 28 | | 29 | N/C | PETn1 |
| 26 | GND(or N/C) | 27 | GND |
| 24 | | 25 | N/C | PERp2 |
| 22 | | 23 | N/C | PERn2 |
| 20 | GND(or N/C) | 21 | GND |
| 18 | N/C(or 3.3V) | 19 | N/C | PETp2 |
| 16 | N/C(or 3.3V) | 17 | N/C | PETn2 |
| 14 | N/C(or 3.3V) | 15 | GND |
| 12 | 3.3V | 13 | N/C | PERp3 |
| 10 | DAS/DSS#(I/O) | LED1# | 11 | N/C | PERn3 |
| 8 | | 9 | GND |
| 6 | | 7 | N/C | PETp3 |
| 4 | N/C(or 3.3V) | 5 | N/C | PETn3 |
| 2 | N/C(or 3.3V) | 3 | GND |
| | | 1 | GND |

KEY {60,62,64,66}  KEY {59,61,63,65}

STORAGE DEVICES AND METHODS OF OPERATING STORAGE DEVICES

CROSS-REFERENCE TO RELATED APPLICATION

This application claims priority from Korean Patent Application No. 10-2020-0099602, filed on Aug. 10, 2020, in the Korean Intellectual Property Office, the disclosure of which is incorporated herein by reference in its entirety.

BACKGROUND

1. Field

Methods, apparatuses and systems consistent with example embodiments relate generally to storage, and more particularly to storage devices and methods of operating storage devices.

2. Related Art

Storage devices are devices for storing data according to control of host devices such as a computer, a smart phone, and/or a smart pad. The storage devices include a device for storing data on a magnetic disk, such as a hard disk drive (HDD), and a device for storing data on a semiconductor memory, such as a solid state drive (SSD) and a memory card, that is, a non-volatile memory.

Use of a storage device including a non-volatile memory is expanding from personal computers to business computers such as a data server. With the expanded use of a storage device, various functions and form factors of storage devices are required in individual fields. A storage device is connected to various hosts and transmits high-frequency signals to a host, and thus there is a need for enhancement of signal characteristics output from the storage device.

SUMMARY

Some example embodiments provide a storage device capable of enhancing signal integrity of signals output from the storage device.

Some example embodiments provide a method of operating a storage device, capable of enhancing signal integrity of signals output from the storage device.

According to example embodiments, a storage device includes a plurality of nonvolatile memory devices provided on a printed circuit board (PCB), a connector, a storage controller and at least one first passive filter. The connector is provided in the PCB and includes a plurality of connection terminals. The storage controller is provided on the PCB, communicates with an external host through the connection terminals and controls the plurality of nonvolatile memory devices. The at least one first passive filter is provided in the PCB, is connected between the connector and the storage controller, and performs an equalization on either a signal provided to the storage controller or a signal provided from the storage controller.

According to example embodiments, a method of operating a storage device includes providing a storage controller and a plurality of nonvolatile memory devices on a printed circuit board (PCB), providing a connector including a plurality of connection terminals in the PCB, providing data transmission lines electrically connecting the storage controller and the plurality of nonvolatile memory devices in the PCB, providing at least one passive filter between the connector and the storage controller in the PCB, performing an equalization, using the at least one passive filter, on either a signal provided to the storage controller or a signal provided from the storage controller, and communicating, using the storage controller, with an external host through the connector According to example embodiments, a storage device includes a plurality of nonvolatile memory devices provided on a printed circuit board (PCB), a connector, a storage controller and at least one first passive filter. The connector is provided in the PCB and includes a plurality of connection terminals. The storage controller is provided on the PCB, communicates with an external host through the connection terminals and controls the plurality of nonvolatile memory devices. The at least one first passive filter is provided in the PCB, is connected between the connector and the storage controller, and performs an equalization on either a signal provided to the storage controller or a signal provided from the storage controller. The at least one passive filter includes a filter resistor and a filter capacitor connected in parallel between a first node and a second node. The filter resistor and the filter capacitor are provided in the PCB. The first node is coupled to the storage controller and the second node is coupled to the connector.

Accordingly, at least one passive filter is provided in the PCB between the connector, through which the storage controller communicate with an external host, and the storage controller and the least one passive filter performs equalization on signals provided from the storage controller or provided to the storage controller. Therefore, signal integrity of high-frequency signal output from the storage controller to the host is improved and thus, power consumption of the storage device may be reduced.

BRIEF DESCRIPTION OF THE DRAWINGS

The above and other objects and features will become more apparent from the following description of example embodiments with reference to the accompanying drawings, in which:

FIG. 6 illustrates connection terminals of the connector in FIGS. 5A and 5B according to example embodiments.

DETAILED DESCRIPTION

Hereinafter, example embodiments will be described more fully hereinafter with reference to the accompanying drawings, in which some example embodiments are shown.

Figure 1:
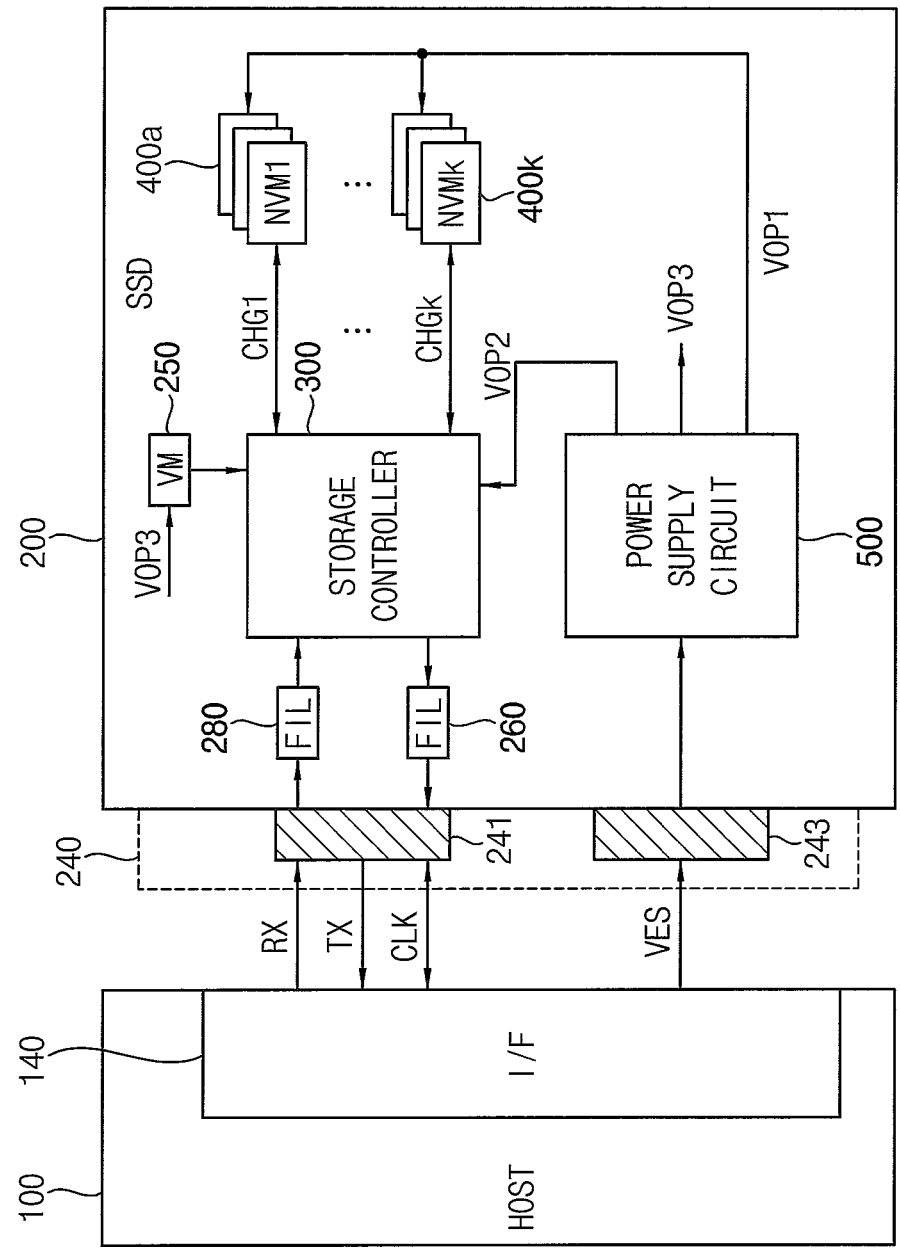
FIG. 1 is a block diagram illustrating a storage system according to example embodiments.

FIG. 1 is a block diagram illustrating a storage system according to example embodiments.

Referring to FIG. 1, a storage system may include a host 100 and a storage device 200. The host 100 may include a storage interface 140.

In FIG. 1, the storage device 200 is illustrated as a solid state drive (SSD) device as an example. However, example embodiments are not limited thereto. According to some example embodiments, the storage device 200 may be any kind of storage devices.

The storage device 200 may include a storage controller 300, a plurality of nonvolatile memory devices 400a~400k (where k is an integer greater than two), a power supply circuit 500 and a connector 240. The connector 240 may include a signal connector 241 and a power connector 243. The storage device 200 may further include a volatile memory device 250.

The plurality of nonvolatile memory devices 400a~400k may be used as a storage medium of the storage device 200. In some example embodiments, each of the plurality of nonvolatile memory devices 400a~400k may include a flash memory or a vertical NAND memory device. The storage controller 300 may be coupled to the plurality of nonvolatile memory devices 400a~400k through a plurality of channels CHG1~CHGk, respectively.

The storage controller 300 may receive a reception signal RX from the host 100 may transmit a transmission signal TX to the host 100, and may exchange a clock signal CLK with the host 100 through the signal connector 241. The reception signal RX may include a command signal, an address signal and a data.

The storage controller 300 may write the data to the plurality of nonvolatile memory devices 400a~400k or read the data from plurality of nonvolatile memory devices 400a~400k based on the command signal and the address signal. That is, storage controller 300 may communicate with the host 100 through the connector 240.

The storage controller 300 may communicate the data with the host 100 using the volatile memory device 250 as an input/output buffer. In some example embodiments, the volatile memory device 250 may include a dynamic random access memory (DRAM).

In addition, the storage device 200 may include at least one passive filter 260 and 280 connected between the storage controller 300 and the signal connector 241. The at least one passive filter 260 and 280 may perform equalization on either a signal provided to the storage controller 300 or a signal provided by the storage controller 300.

The at least one passive filter 260 and 280 may be provided in a printed circuit board (PCB) on which the storage controller 300 and the plurality of nonvolatile memory devices 400a~400k are provided. The at least one passive filter 260 and 280 may be provided (or, formed) by using at least a portion of the PCB.

The passive filter 260 may perform equalization on signals provided to the host 100 from the storage controller 300 and the passive filter 280 may perform equalization on signals provided to the storage controller 300 from the host 100. That is, the at least one passive filter 260 and 280 may enhance signal integrity of signals exchanged between the host 100 and the storage device 200. The signals may be indicative of data.

The power supply circuit 500 may be configured to receive a power supply voltage (i.e., external supply voltage) VES from the host 100 through the power connector 243. The adaptive power supply circuit 500 may generate, based on the power supply voltage VES, at least one first operation voltage VOP1 used by the plurality of nonvolatile memory devices 400a~400k, at least one second operation voltage VOP2 used by the storage controller 300, and at least one third operation voltage VOP3 used by the volatile memory device 250.

The power supply circuit 500 may provide the first operation voltage VOP1 to the plurality of nonvolatile memory devices 400a~400k, may provide the second operation voltage VOP2 to the storage controller 300, and may provide the third operation voltage VOP3 to the volatile memory device 250

Figure 2:
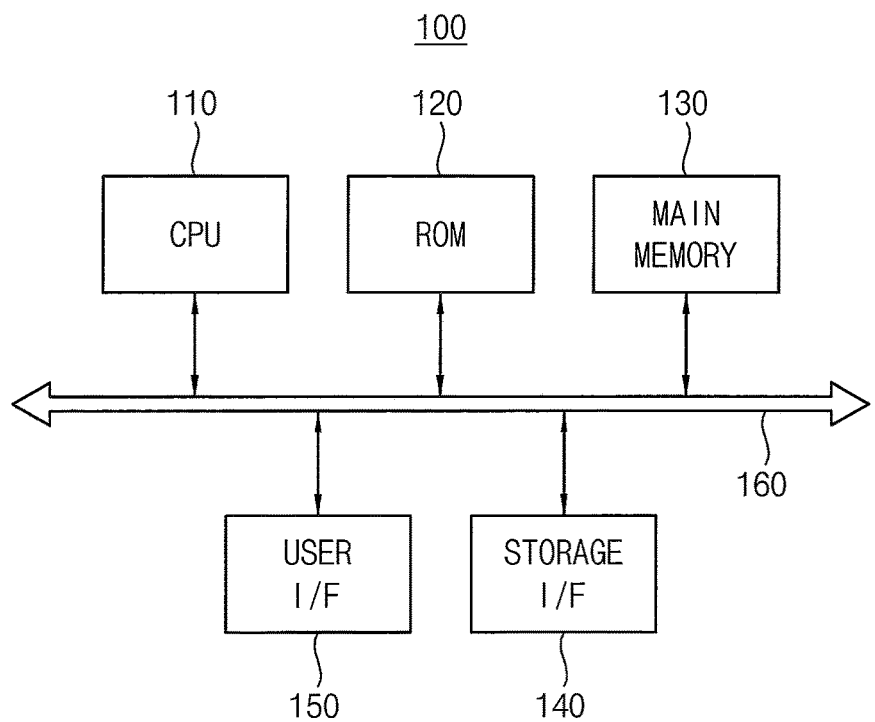
FIG. 2 is a block diagram illustrating the host in FIG. 1 according to example embodiments.

FIG. 2 is a block diagram illustrating the host in FIG. 1 according to example embodiments.

Referring to FIG. 2, the host 100 may include a central processing unit (CPU) 110, a read-only memory (ROM) 120, a main memory 130, a storage interface 140, a user interface 150 and a bus 160.

The bus 160 may refer to a channel via which data is transceived between the CPU 110, the ROM 120, the main memory 130, the storage interface 140 and the user interface 150 of the host 100. The ROM 120 may store various application programs. For example, application programs supporting storage protocols such as Advanced Technology Attachment (ATA), Small Computer System Interface (SCSI), embedded Multi Media Card (eMMC), and/or Unix File System (UFS) protocols are stored.

The main memory 130 may temporarily store data or programs. The user interface 150 may be a physical or virtual medium for exchanging information between a user and the host device 100, a computer program, etc., and includes physical hardware and logical software. For example, the user interface 150 may include an input device for allowing the user to manipulate the host 100, and an output device for outputting a result of processing an input of the user.

The CPU 110 may control overall operations of the host 100. The CPU 110 may generate a command for storing data in the storage device 200 or a request (or a command) for reading data from the storage device 200 by using an application stored in the ROM 120, and transmit the request to the storage device 200 via the storage interface 140.

Figure 3:
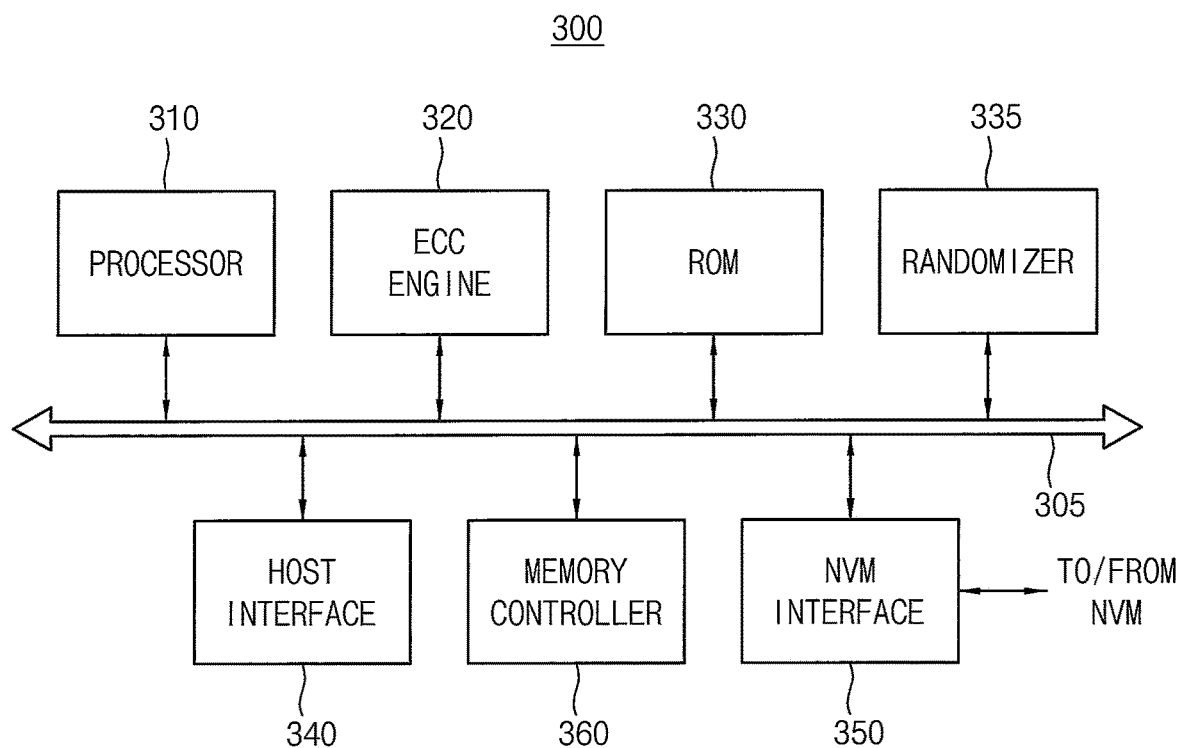
FIG. 3 is a block diagram illustrating an example of the storage controller in FIG. 1 according to example embodiments.

FIG. 3 is a block diagram illustrating an example of the storage controller in FIG. 1 according to example embodiments.

Referring to FIG. 3, the storage controller 300 may include a processor 310, an error correction code (ECC) engine 320, a ROM 330, a randomizer 335, a host interface 340, a memory controller 360 and a nonvolatile memory interface 350 which are connected via a bus 305.

The processor 3101 controls an overall operation of the memory controller 360.

Threshold voltage distributions of memory cells of the nonvolatile memory devices 400a~400k may vary due to causes, such as a program elapsed time, a temperature, program disturbance, read disturbance and etc. For example, data stored at the nonvolatile memory devices 400a~400k becomes erroneous due to the above causes. The storage controller 300 utilizes a variety of error correction techniques to correct such errors. For example, the storage controller 300 may include the ECC engine 320. The ECC engine 320 may correct errors in data read from the nonvolatile memory devices 400a~400k.

The ROM 330 may store firmware and the firmware may loaded to the volatile memory device 250 and driven by the processor 310.

The randomizer 335 randomizes data to be stored in the nonvolatile memory devices 400a~400k. For example, the randomizer 335 may randomize data to be stored in the nonvolatile memory devices 400a~400k in a unit of a word-line.

Data randomizing is to process data such that program states of memory cells connected to a word-line have the same ratio. For example, if memory cells connected to one word-line are multi-level cells (MLC) each storing 2-bit data, each of the memory cells has one of an erase state and first through third program states.

In this case, the randomizer 335 randomizes data such that in memory cells connected to one word-line, the number of memory cells having the erase state, the number of memory cells having the first program state, the number of memory cells having the second program state, and the number of memory cells having the third program state are substantially the same as one another. For example, memory cells in which randomized data is stored have program states of which the number is equal to one another.

The randomizer 335 de-randomizes data read from the nonvolatile memory devices 200a~200k.

The storage controller 300 may communicate with the host 100 through the host interface 340 and may communicate with the nonvolatile memory devices 400a~400k through the nonvolatile memory interface 350. The storage controller 300 may control the volatile memory device 250 through the memory controller 360.

Figure 4:
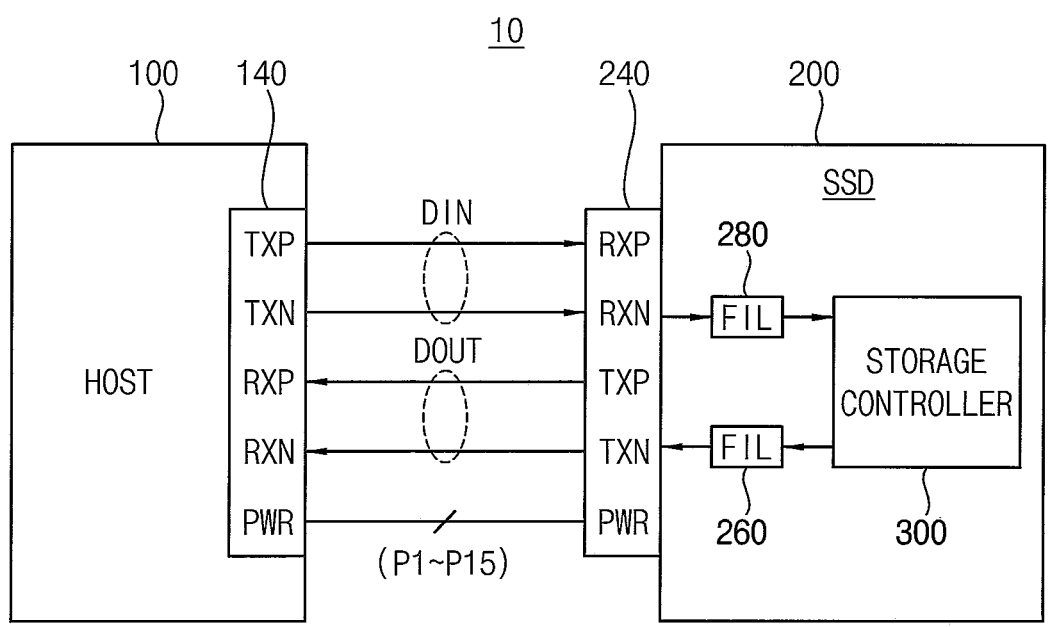
FIG. 4 is a block diagram further illustrating an example of an interface for the storage system of FIG. 1.

FIG. 4 is a block diagram illustrating further aspects of an example of an interface for the storage system of FIG. 1.

In FIG. 4, a SATA interface is shown as an example. However, example embodiments are not limited thereto.

The storage interface 140 and the connector 240 may be connected via a SATA cable including a data segment and a power segment.

The data segment (i.e., the signal connector 241) is shown to include two unidirectional data line pairs, DIN and DOUT. DIN is used to provide data from the host 100 to the storage device 200. DOUT is used to provide data from the storage device 200 to the host 100. The data lines implementing DIN and DOUT may be connected between respective transmission (TX) terminals and receiving (RX) terminals (e.g., TXP, TXN, RXP, and RXN terminals) of the host 100 and storage device 200. The data segment may be also referred to as a signal segment.

The power segment (i.e., the power connector 243) includes fifteen power lines (e.g., P1 to P15). The power segment may be connected to various power terminals (PWR) of the host 100 and storage device 200, and may be respectively used to provide various voltages, such as 3.3V, 5V and 12V, from the host 100 to the SSD 200.

The passive filters 260 and the 280 may be provided between the connector 240 and the storage controller 300.

Figure 5A:
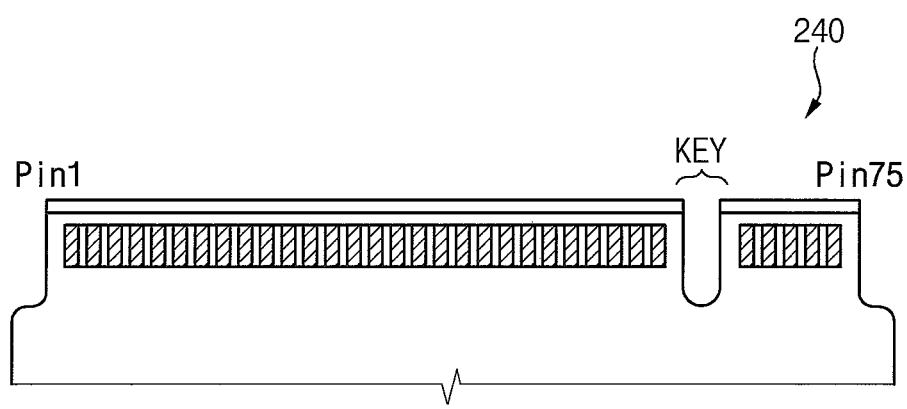
FIG. 5A shows an upper surface of the connector in FIG. 1 according to example embodiments.
Figure 5B:
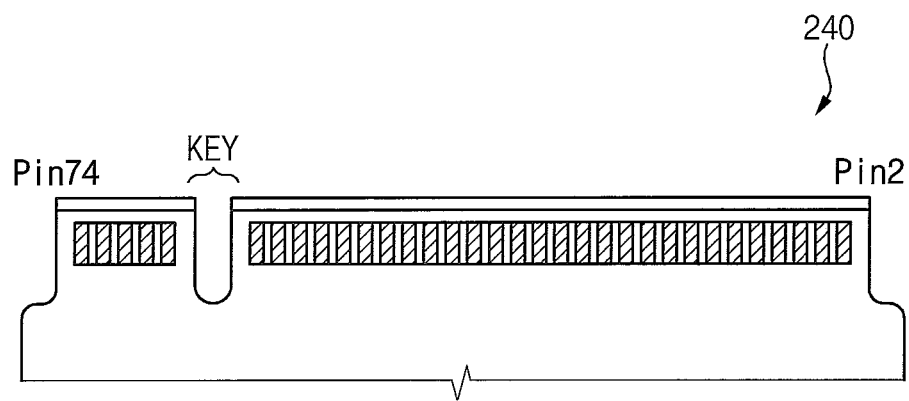
FIG. 5B shows a lower surface of the connector in FIG. 1 according to example embodiments.

FIG. 5A shows an upper surface of the connector in FIG. 1 according to example embodiments, and FIG. 5B shows a lower surface of the connector in FIG. 1 according to example embodiments.

As shown in FIG. 5A, odd-numbered pins among first to 75th pins may be disposed in parallel on the upper surface of the connector 240. As shown in FIG. 5B, even-numbered pins among the second to 74th pins may be disposed in parallel on the lower surface of the connector 240.

The connector 240 may provide a key in which no pin is disposed. The key may prevent the connector 240 from being inverted when inserted into the host 100. For example, the key may be off center of the connector 240 and may be formed at positions of the 59th to 66th pins (Pin59 to Pin66). Pins of the connector 240 may be arranged to support a communication interface such as PCIe. The arrangement of pins may be changed to support other communication interfaces.

FIG. 6 illustrates connection terminals of the connector in FIGS. 5A and 5B according to example embodiments.

Referring to FIGS. 5A and 6, first to 75th pins of the connector 240 are illustrated. For example, odd-numbered pins among first to 75th pins may be disposed on the upper surface of the connector 240, and even-numbered pins among the second to 74th pins may be disposed on the lower surface of the connector 240.

The first, third, ninth, 15th, 21st, 27th, 33rd, 39th, 45th, 51st, 57th, 71st, 73rd, and 75th pins Pin1, Pin3, Pin9, Pin15, Pin21, Pin27, Pin33, Pin39, Pin45, Pin51, Pin57, Pin71, Pin73, and/or Pin75 may be configured to be connected to a ground voltage GND without regard to communication type of the storage device 200.

The second, fourth, 14th, 16th, 18th, 70th, 72nd, and 74th pins Pin2, Pin4, Pin14, Pin16, Pin18, Pin70, Pin72, and Pin74 may not be connected (not connected (N/C)) or receive a power of 3.3 V depending on a power mode. The power mode may be determined based on the communication type of the storage device 200 or without regard to communication type of the storage device 200. N/C may denote that a pin is not connected to the storage controller 300 through physical wiring. In some example embodiments, N/C may denote that a pin is connected to the storage controller 300 through physical wiring but the storage controller 300 may not use the pin.

The 40th and 42nd pins (Pin40 and Pin42) may form a sideband interface as a part of a system management bus (SMBus). The 40th pin (Pin40) may input a clock SMB_CLK of the system management bus from the host 100 to the connector 240 or may output the clock SMB_CLK from the connector 240 to the host device 100. The 40th pin (Pin40) may switch between 0 V and 1.8 V.

The 42nd pin (Pin42) may input data SMB_DATA of the system management bus from the host 100 to the connector 240 or may output the data SMB_DATA from the connector 240 to the host 100. The 42nd pin (Pin42) may switch between 0 V and 1.8 V.

The 56th and 58th pins (Pin56 and Pin58) may be used during a manufacture process of the storage device 200. The 56th pin Pin56 may be reserved for manufacturing data transfer (MFG_DATA) during manufacturing.

The 58th pin Pin58 may be reserved for manufacturing clock transfer (MFG_CLK) during manufacturing. The 56th and 58th pins (Pin56 and Pin58) may not be used after manufacturing of the storage device 200 is finished, i.e., during normal operation of the storage device 200. The 68th pin (Pin68) may be used for receiving a suspend clock SUSCLK in a low-power mode. For example, the suspend clock SUSCLK may have a frequency of 32 kHz.

The 59th to 66th pins (Pin59 to Pin66) correspond to the key shown in FIG. 2 and may not be provided in practice. However, the 59th to 66th pins (Pin59 to Pin66) are shown in FIG. 6 to clearly describe pin numbers.

The fifth pin (Pin5) may be used as a third negative transmission terminal PETn3 in a PCIe communication interface. The seventh pin (Pin7) may be used as a third positive transmission terminal PETp3 in the PCIe communication interface. The 11th pin (Pin11) may be used as a third negative reception terminal PERn3 in the PCIe communication interface.

The 13th pin (Pin13) may be used as a third positive reception terminal PERp3 in the PCIe communication interface.

The 17th pin (Pin17) may be used as a second negative transmission terminal PETn2 in the PCIe communication interface. The 19th pin (Pin19) may be used as a second positive transmission terminal PETp2 in the PCIe communication interface. The 23rd pin (Pin23) may be used as a second negative reception terminal PERn2 in the PCIe communication interface.

The 25th pin (Pin25) may be used as a second positive reception terminal PERp2 in the PCIe communication interface.

The 29th pin (Pin29) may be used as a first negative transmission terminal PETn1 in the PCIe communication interface. The 31st pin (Pin31) may be used as a first positive transmission terminal PETp1 in the PCIe communication interface. The 35th pin (Pin35) may be used as a first negative reception terminal PERn1 in the PCIe communication interface. The 37th pin (Pin37) may be used as a first positive reception terminal PERp1 in the PCIe communication interface.

The 41st pin (Pin41) may be used as a zeroth negative transmission terminal PETn0 in the PCIe communication interface. The 43rd pin (Pin43) may be used as a zeroth positive transmission terminal PETp0 in the PCIe communication interface.

The 47th pin (Pin47) may be used as a zeroth negative reception terminal PERn0 in the PCIe communication interface. The 49th pin (Pin49) may be used as a zeroth positive reception terminal PERp0 in the PCIe communication interface.

The 53rd pin (Pin53) may be used for receiving a negative reference clock REFCLKn in the PCIe communication interface. The 55th pin (Pin55) may be used for receiving a positive reference clock REFCLKp in the PCIe communication interface.

The 10th pin (Pin10) may be used by the storage device 200 to transmit a signal LED1 # for controlling an external light-emitting diode (LED) to the outside (e.g., the host device 100).

The 38th connection terminal 38 may be used to transmit or receive a device sleep signal DEVSLP or a power disable signal PWDIS in the SATA communication type and may be not connected N/C in the PCIe communication type. The 44th connection terminal 44 may be not connected N/C in the SATA communication type and may be used to receive or transmit an alert signal ALERT # in the PCIe communication type. The 44th connection terminal 44 may be included in the system management bus SMBus in the PCIe communication type.

The 50th connection terminal 50 may be not connected N/C in the SATA communication type and may be used to receive a reset signal PERST #0 in the PCIe communication type. The 52nd connection terminal 52 may be not connected N/C in the SATA communication type and may be used to transmit or receive a clock request signal CLKREQ # in the PCIe communication type. The 54th connection terminal 54 may be not connected N/C in the SATA communication type and may be used to transmit or receive a wakeup signal PEWAKE # in the PCIe communication type.

The 69th connection terminal 69 may be used to notify the external host device of information about the communication type of the storage device 100. The 69th connection terminal 69 may be connected to a ground node of the storage device 200 in the SATA communication type and may provide a ground voltage to the host device as a notification signal PEDET. The 69th connection terminal 69, in the PCIe communication type, may be not connected N/C or may be floated. That is, the 69th connection terminal 69 may be used for the storage device 200 to support the multiple communication protocols, in detail, to determine whether to use any one of the multiple communication protocols.

The 6th, 8th, 20th, 22nd, 24th, 26th, 28th, 30th, 32nd, 34th, 36th, 46th, 48th, and 67th connection terminals 6, 8, 20, 22, 24, 26, 28, 30, 32, 34, 36, 46, 48, and 67 may be used to support power modes.

The description on the connection terminals are just for examples, and a number and a function of each of the connection terminals may vary based on communication protocols.

Figure 7:
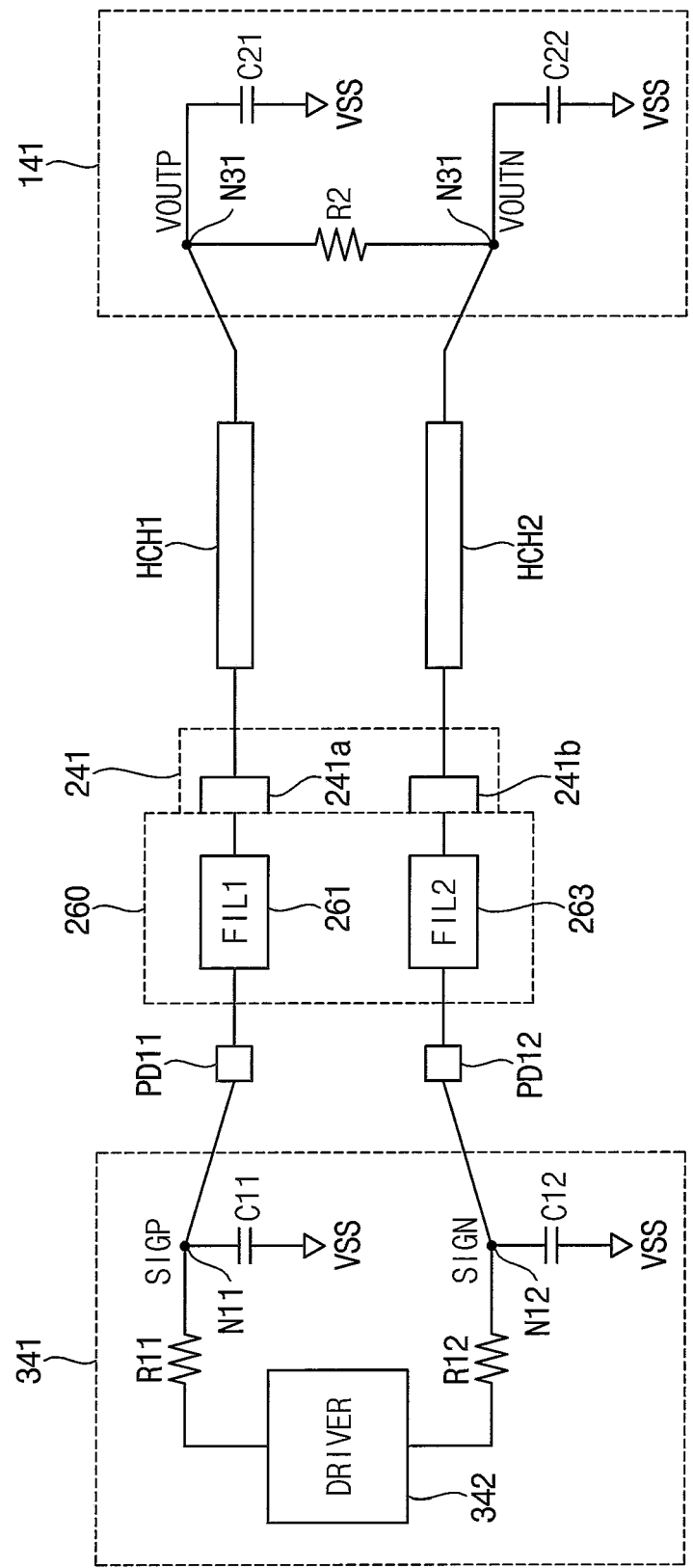
FIG. 7 illustrates a relationship of the passive filter, the storage controller and the host in FIG. 1 according to example embodiments.

FIG. 7 illustrates a relationship of the passive filter, the storage controller and the host in FIG. 1 according to example embodiments.

In FIG. 7, a receiver 141 in the storage interface in FIG. 2 and a transmitter 241 in the host interface 340 are also illustrated.

In FIG. 7, a transmitter 341 includes a driver 342 for transmitting differential signal SIGP and SIGN to the receiver 141 through pads PD11 and PD12, the passive filter 260, connection terminals 241a and 241b of the signal connector 241 and host channels HCH1 and HCH2.

Referring to FIG. 7, the transmitter 341 includes the driver 342, a first resistor R11, a first capacitor C11, a second resistor R12 and a second capacitor C12.

The first resistor R11 may be coupled between a node N11 and the driver 342, the first capacitor C11 may be coupled between the node N11 and a ground voltage VSS, the second resistor R12 may be coupled between a node N12 and the driver 342, and the second capacitor C12 may be coupled between the node N12 and the ground voltage VSS.

The first resistor R11 and the second resistor R12 may have a same resistance value. The first capacitor C11 and the second capacitor C12 may have a same capacitance value. The transmitter 241 may provide a positive signal SIGP at the node N11 and may provide a negative signal SIGN at the node N12.

The passive filter 260 may include a first filter (FIL1) 261 and a second filter (FIL2) 263.

The first filter 261 may be connected between the pad PD11 and the first connection terminal 241a and the second filter 263 may be connected between the pad PD12 and the second connection terminal 241b. The first filter 261 may equalize (filter) the positive signal SIGP to provide an equalized signal to the host channel HCH1 through the first connection terminal 241a and the second filter 263 may equalize (filter) the negative signal SIGN to provide an equalized signal to the host channel HCH2 through the second connection terminal 241b.

The first connection terminal 241a may be connected to the receiver 141 through the host channel HCH1 and the second connection terminal 241b may be connected to the receiver 141 through the host channel HCH2.

The receiver 141 may include a resistor R2, a first capacitor C21 and a second capacitor C22.

The resistor R2 may be coupled between a node N31 and a node N32, the first capacitor C21 may be coupled between the node N31 and the ground voltage VSS and the second capacitor C22 may be coupled between the node N32 and the ground voltage VSS. The first capacitor C21 and the second capacitor C22 may have a same capacitance. A positive voltage signal VOUTP in response to the positive signal SIGP is provided at the node N31 and a negative voltage signal VOUTN in response to the negative signal SIGN is provided at the node N32.

Figure 8:
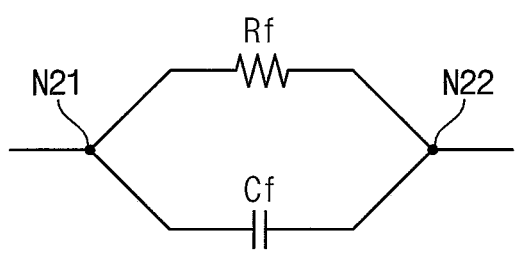
FIG. 8 illustrates an example of the first filter in FIG. 7 according to example embodiments.

FIG. 8 illustrates an example of the first filter in FIG. 7 according to example embodiments.

Referring to FIG. 8, the first filter 261 may include a filter resistor Rf and a filter capacitor Cf coupled in parallel between a first node N21 and a second node N22.

A configuration of the second filter 263 may be the same as a configuration of the first filter 261 of FIG. 7. At least one of the filter resistor Rf and the filter capacitor Cf may be provided by using at least a portion of the PCB.

The resistor R2 and the capacitors C21 and C22 in the receiver 141 in FIG. 7 and the filter resistor Rf and the filter capacitor Cf in the first filter 261 in FIG. 8 may constitute a passive continuous time linear equalizer (CLTE). The passive CLTE may provide enhanced linearity and signal integrity of the voltage signals VOUTP and VOUTN may be increased.

Figure 9:
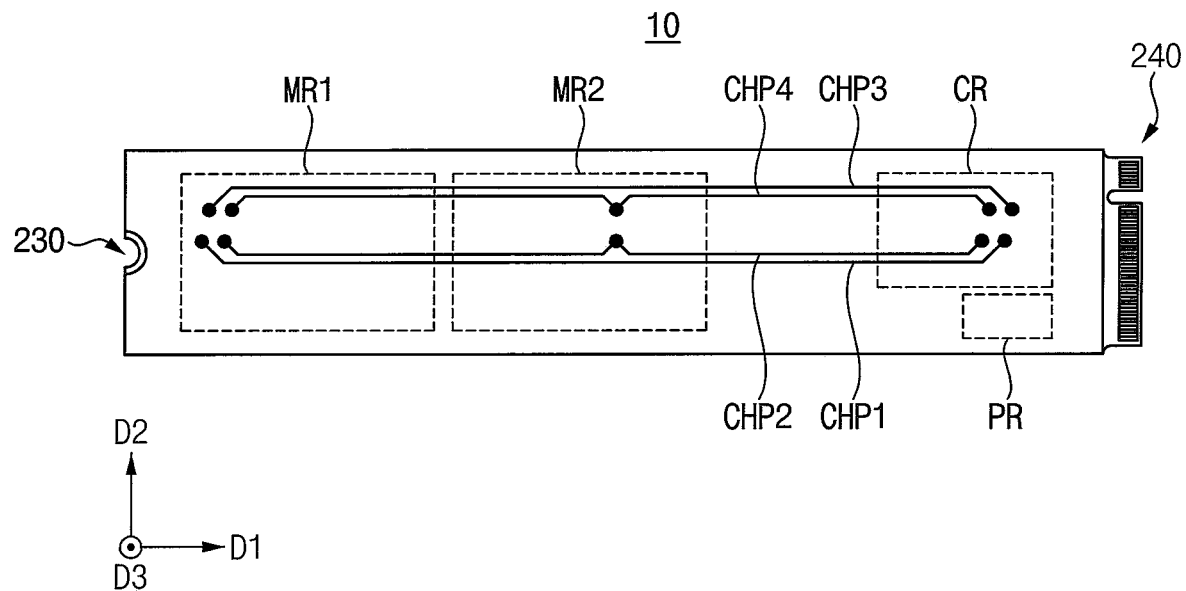
FIGS. 9 and 10 are a plan view and a cross-sectional view illustrating a PCB on which a storage device is mounted according to example embodiments, respectively.
Figure 10:
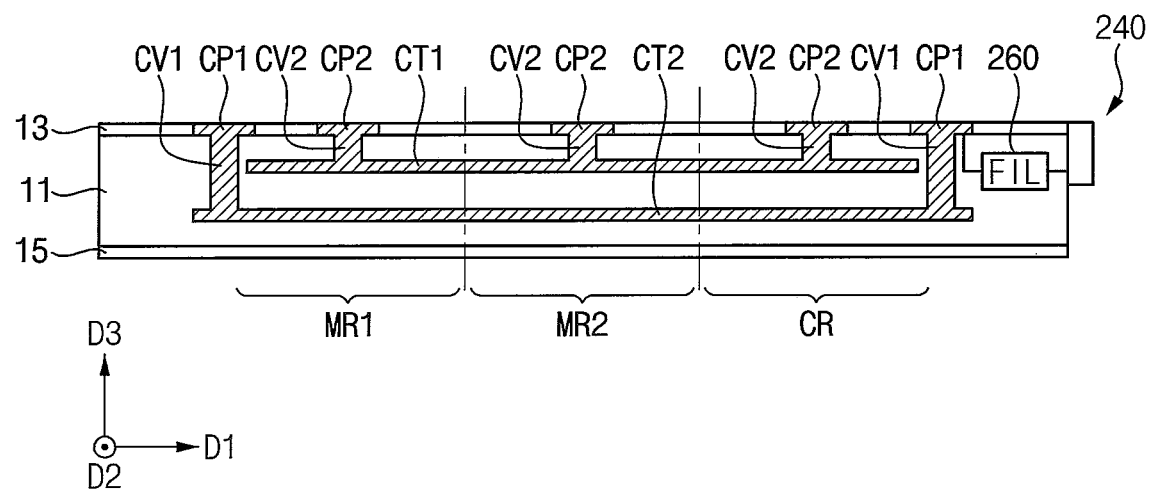

FIGS. 9 and 10 are a plan view and a cross-sectional view illustrating a PCB on which a storage device is mounted according to example embodiments, respectively.

Referring to FIGS. 9 and 10, a PCB 10 is illustrated as including first through fourth channel patterns CHP1 through CHP4.

The PCB 10 may include a body layer 11, a top protection layer 13, and a bottom protection layer 15. The PCB 10 may include wiring units, and the wiring units on the PCB 10 may be electrically connected to the storage controller 300 and the nonvolatile memory devices 400a~400k. In addition, the PCB 10 may include the connector 240. The PCB 10 may be electrically connected to a module substrate, a system board, a main board, etc. through the connector 240, on which the PCB is mounted.

In the body layer 11, the wiring units of a multi-layer or a single layer may be formed, and through the wiring units, the PCB 10 may be electrically connected to storage controller 300 and the nonvolatile memory devices 400a~400k. The top and bottom protection layers 13 and 15 may perform a protection function and may be formed with solder resist.

In addition, the body layer 11 may be generally implemented by pressing to a certain thickness a high polymer material such as thermosetting resin, epoxy resin or phenolic resin such as flame retardant 4 (FR-4), bismaleimide triazine (BT), and Ajinomoto build-up film (ABF), forming the pressed result into a thin layer, coating copper foil on both sides of the formed thin layer, and forming through patterning the wiring units which are transmission paths of electrical signals.

In addition, the PCB 10 may be differentiated into a single layer PCB forming the wirings on one side thereof and a double layer PCB forming the wirings on both sides thereof. In addition, the number of thin layers may be 3 or more and may be formed by using an insulating material such as prepreg, and a PCB including multi-layer wirings may be implemented by forming 3 or more wiring layers according to the number of formed thin layers.

The PCB 10 may be a substrate on which the semiconductor package is mounted thereon and include an insulating layer and the wiring unit. The wiring unit may include a first conductive trace CT1 and a second conductive trace CT2, which are formed in the insulating layer, and may include a first conductive via CV1 that passes through the insulating layer and is connected to the first conductive trace CT1, and a second conductive via CV2 that passes through the insulating layer and is connected to the second conductive trace CT2.

A first channel pattern CHP1 may be a first wiring unit and may include the first conductive trace CT1 extending in a first direction D1, the first conductive via CV1 extending in a third direction D3, and a first conductive pad CP1 formed on a top side of the first conductive via CV1.

A second channel pattern CHP2 may be a second wiring unit and may include the second conductive trace CT2 extending in the first direction D1, the second conductive via CV2 extending in the third direction D3, and a second conductive pad CP2 formed on a top side of the second conductive via CV2.

In some example embodiments, the second channel pattern CHP2 formed in a daisy chain manner/topology may have different wiring lengths in a first mounting area MR1 and a second mounting area MR2 to compensate for signal loss in only any one of the first mounting area MR1 and the second mounting area MR2.

In some example embodiments, a semiconductor package in the first mounting area MR1 may be electrically connected to the first through fourth channel patterns CHP1 through CHP4, and a semiconductor package in the second mounting area MR2 may be electrically connected to the second and third channel patterns CHP2 and CHP3.

Although only the first and second channel patterns CHP1 and CHP2 are illustrated in FIG. 10 for convenience of description, the first and fourth channel patterns CHP1 and CHP4 may be configured to be substantially the same as each other in a point to point manner/topology (or may be configured as one channel pattern group), and the second and third channel patterns CHP2 and CHP3 may be configured to be substantially the same as each other in a daisy chain manner/topology (or may be configured as another channel pattern group). The second channel pattern CHP2 and the third channel pattern CHP3 may be formed to face each other and adjacent to each other, and the first channel pattern CHP1 and the fourth channel pattern CHP4 may be formed to face each other with the second channel pattern CHP2 and the third channel pattern CHP3 therebetween. Because the second and third channel patterns CHP2 and CHP3 are formed in a daisy chain manner/topology and have branching points in the middle thereof, the branching points may be configured in an arrangement shape as described above, so that the branching points do not overlap the first and fourth channel patterns CHP1 and CHP4, in other words, for easiness of circuit design.

In FIG. 10, the second conductive trace CT2 of the second channel pattern CHP2 is illustrated as being formed on a layer closer to the bottom protection layer 15 than the first conductive trace CT1 of the first channel pattern CHP1. However, example embodiments are not limited thereto and the first conductive trace CT1 of the first channel pattern CHP1 may be formed on a layer closer to the bottom protection layer 15 than the second conductive trace CT2 of the second channel pattern CHP2, and the first conductive trace CT1 of the first channel pattern CHP1 and the second conductive trace CT2 of the second channel pattern CHP2 may also be formed on the same layer.

The storage controller area CR and the first mounting area MR1 may include all of the first and second conductive vias CV1 and CV2 and the first and second conductive pads CP1 and CP2, which are included in the first through fourth channel patterns CHP1 through CHP4, and the second mounting area MR2 may include only a portion of the first and second conductive vias CV1 and CV2 and the first and second conductive pads CP1 and CP2 which are included in the second and third channel patterns CHP2 and CHP3.

In addition, the PCB 10 may include a power supply area PR next to the storage memory controller area CR.

Figure 11:
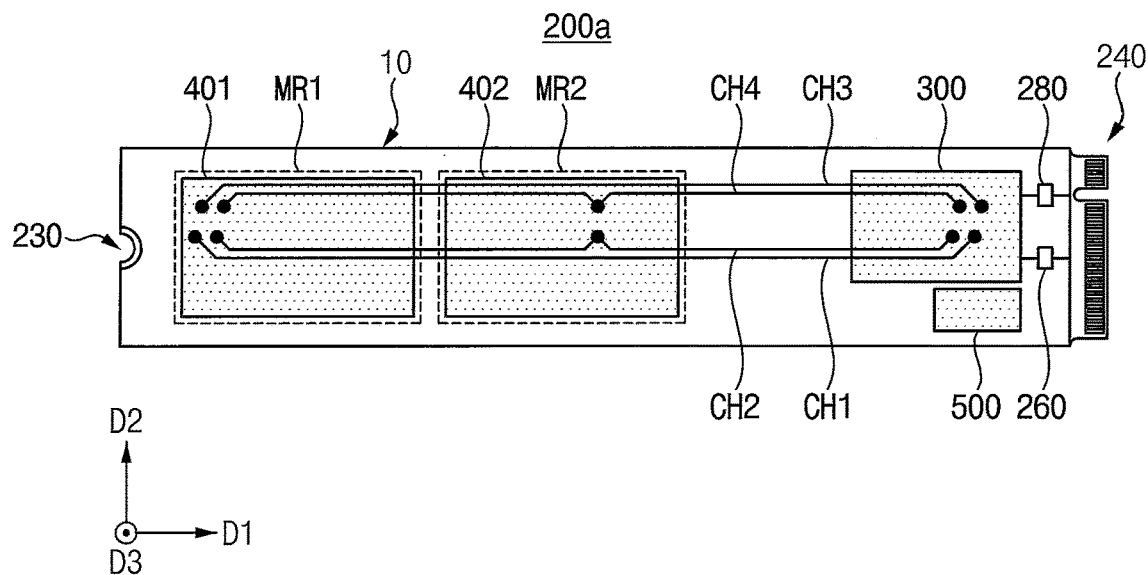
FIGS. 11 and 12 are a plan view and a cross-sectional view illustrating a storage device according to example embodiments.
Figure 12:
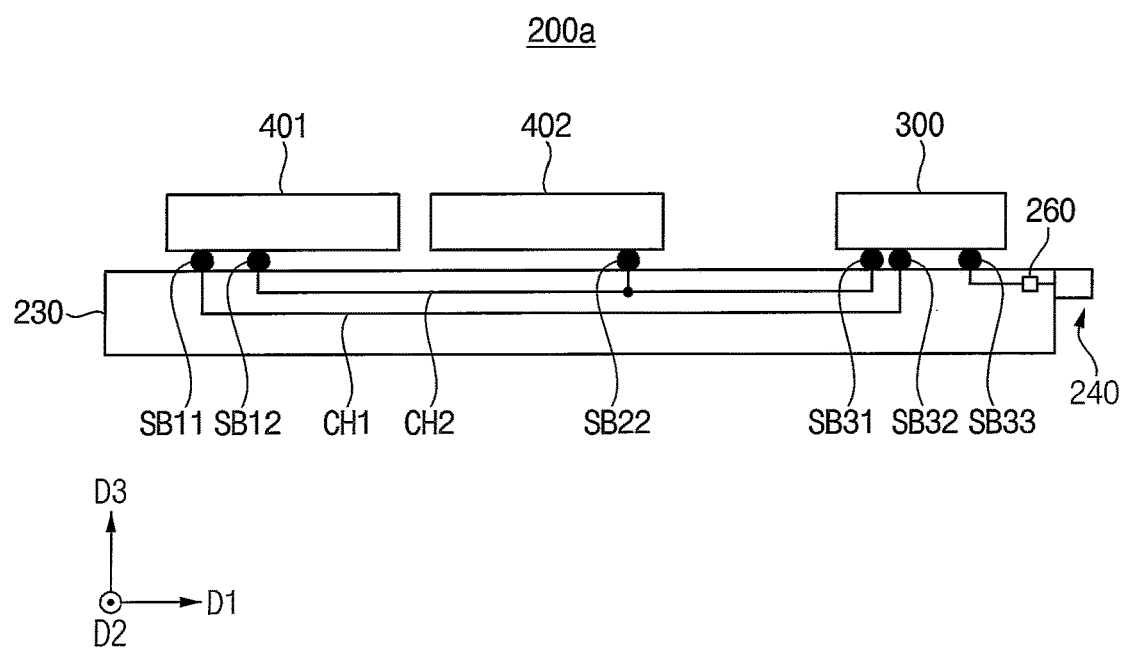

FIGS. 11 and 12 are a plan view and a cross-sectional view, respectively, illustrating a storage device according to example embodiments.

Referring to FIGS. 11 and 12, there is provide a storage device 200a in which a first memory package 401 may be mounted only in the first mounting area MR1 of the PCB 10, a second memory package 402 may be mounted only in the second mounting area MR2 of the PCB 10, the first and fourth channels CH1 and CH4 are connected to the first memory package 401 and the second and third channels CH2 and CH3 are connected to the second memory package 402.

Each of the first memory package 401 and the second memory package 402 may be formed by stacking at least some of the nonvolatile memory devices 400a~400k in FIG. 1. The first memory package 401 may be connected to the first and second channels CH1 and CH2 through solder balls SB11 and SB12, the second memory package 402 may be connected to the second channel CH2 through solder ball SB22 and the storage controller 300 may be connected to the first and second channels CH1 and CH2 through solder balls SB31 and SB32.

The passives filters 260 and 280 connecting the connector 240 and the storage controller 300 are provided in the PCB 10. The passive filter 260 may be connected to the storage controller 300 through a solder ball SB33.

Figure 13:
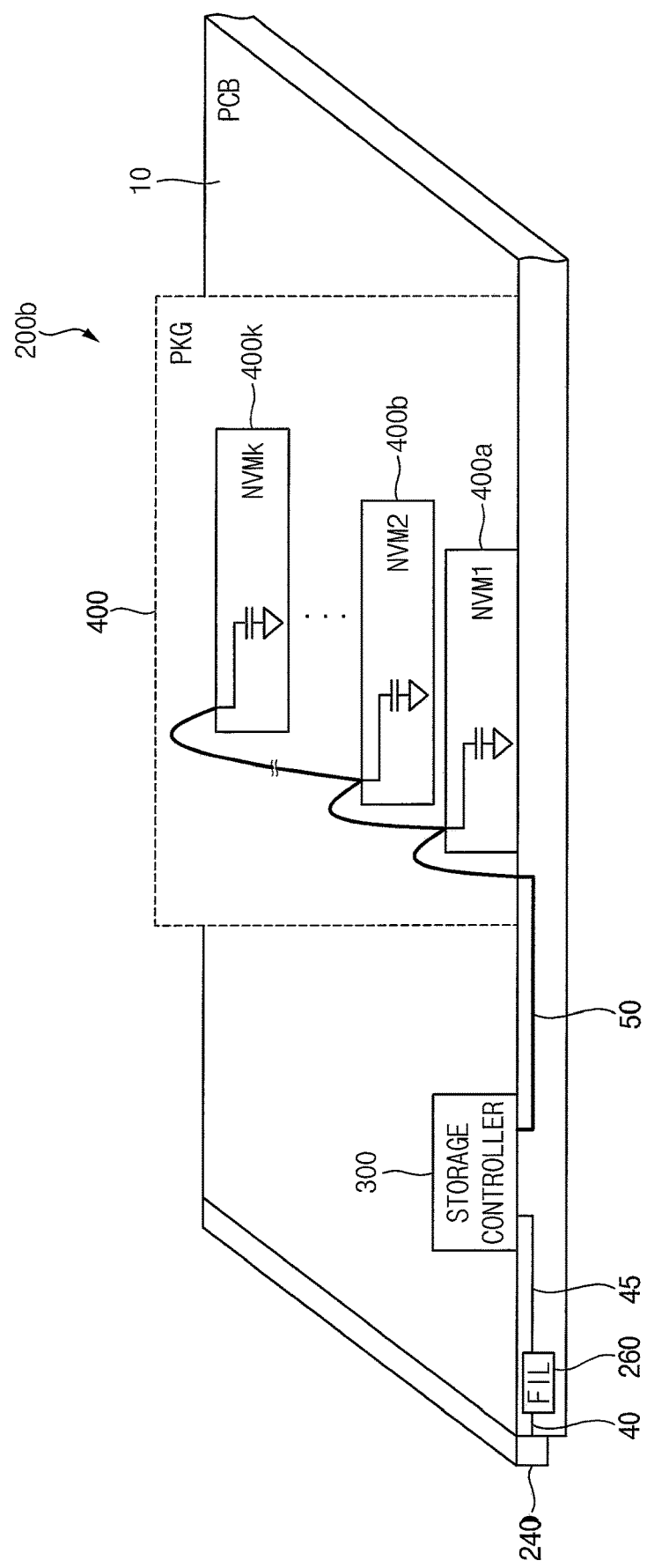
FIG. 13 is a block diagram illustrating an example of the storage device in FIG. 1 according to example embodiments.

FIG. 13 is a block diagram illustrating an example of the storage device in FIG. 1 according to example embodiments.

Referring to FIG. 13, a storage device 200b may include a storage controller 300 and a package 400 including a plurality of nonvolatile memory devices 400a~400k provided on a PCB 10.

The storage controller 300 and the nonvolatile memory devices 400a~400k may be electrically coupled to each other through a transmission line 50. The storage controller 300 may transmit a command signal and an address signal to the nonvolatile memory devices 400a~400k and may exchange data with the nonvolatile memory devices 400a~400k through the transmission line 50.

The storage device 200b may further include a connector 240 provided as a portion of the PCB 10 and at least one passive filter 260 connected between the connector 240 and the storage controller 300. The at least one passive filter 260 is provided in the PCB 10 and may be provided (or formed) by using at least a portion of the PCB 10. The passive filter 260 may be connected to the storage controller 300 through a first conductive pattern 45 and may be connected to the signal connector 241 in FIG. 1 of the connector 240 through a second conductive pattern 40.

As described with reference to FIGS. 7 and 8, the passive filter 260 may equalize a signal provided to the host 100 through the connector 240 from the storage controller 300 to increase linearity of the signal.

Although the storage device 200b illustrated in FIG. 13 includes the storage controller 300 and the package 400 with a plurality of nonvolatile memory devices 400a~400k, the storage device 200b may further include other components such as a power supply circuit and a volatile memory device.

The storage device 200a may include flash memory based data storage media such as a memory card, a smart card, a universal serial bus (USB) memory, a solid state drive (SSD).

The package 400 may include the nonvolatile memory devices 400a~400k. If the nonvolatile memory devices 400a~400k are contained in the package 400 in the form of multi-stack chip, the stacked nonvolatile memory devices 400a~400k are connected to the storage controller 300 through the same channel. When a nonvolatile memory device 400a from which data is to be read or to which data is to be written is selected when a command associated with a read or write operation is received from a host, capacitance of the channel may include parasitic capacitance of unselected nonvolatile memory devices 400a~400k that are not associated with a read or write operation or a copy-back operation, etc.

In terms of signal integrity, the parasitic capacitance influences data transmission through the channel. The nonvolatile memory devices 400a~400k are connected to the same channel and write data is transmitted to a nonvolatile memory through the channel. When a reflection coefficient between the nonvolatile memory devices 400a~400k and the channel is '0', data to be transmitted to a nonvolatile memory may be transferred to the nonvolatile memory without reflection. The reflection coefficient is expressed by the following equation:

$$F=(Zr-Z0)/(Zr+Z0) \qquad \text{[Equation 1]}$$

In Equation 1, 'Zr' indicates impedance of the nonvolatile memory devices 100a~100n and 'Zo' indicates self-impedance of the channel.

Theoretically, reflection may not occur when a value of impedance of the nonvolatile memory devices 400a~400k is equal to that of self-impedance of the channel. Parasitic capacitance of nonvolatile memories connected to the same channel increases in proportion to an increase in the number of nonvolatile memories connected to the same channel.

As the number of nonvolatile memories connected to the same channel increases, probability that signals transmitted to the nonvolatile memory devices 400a~400k from the storage controller 300 are reflected may become higher. Because signals are distorted due to reflection or impedance mismatch, it is desirable to make a measured reactance value of a channel have a predetermined value.

Making a measured reactance value of a channel have a predetermined value is similarly applied to a case when a read data from the nonvolatile memory device is provide to the host 100 through the storage controller because probability that signals transmitted to the host 100 from the storage controller 300 are reflected in the connector 240 may become higher due to parasitic capacitance.

The storage device 200 according to example embodiments provides at least one passive filter 260 connected between the connector 240 and the storage controller 300 in the PCB 10, and may increase signal integrity of signals exchanged between the storage controller 300 and the host 100. That is, storage device 200 may provide an equalizer in the PCB 10 between the connector 240 and the storage controller 300.

Figure 14:
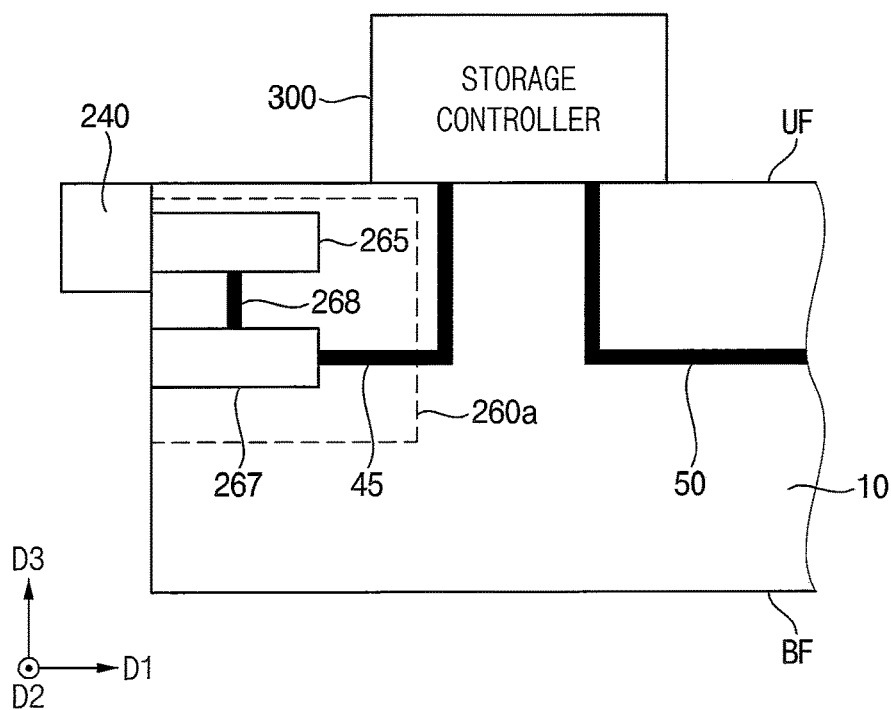
FIG. 14 illustrates an example in which the passive filter in FIG. 13 is provided in the PCB according to example embodiments.

FIG. 14 illustrates an example in which the passive filter in FIG. 13 is provided in the PCB according to example embodiments.

Referring to FIG. 14, a passive filter 260a may include a first pad 265, a second pad 267 and a vertical conductive pattern 268. The first pad 265 may be connected to the connector 240 in the PCB 10. The second pad 267 may be spaced apart from the first pad 265 in a vertical direction D3 from an upper surface UF of the PCB 10 to a lower surface BF of the PCB 10. The vertical conductive pattern 268 may connect the first pad 265 and the second pad 267 in the vertical direction D3.

The first pad 265 and the second pad 267 may provide the filter capacitor Cf in FIG. 8 and the vertical conductive pattern 268 may provide the filter resistor Rf in FIG. 8. The second pad 267 may be connected to the storage controller 300 through the first conductive pattern 45.

The first pad 265 is an element directly connected to the connector 240, the second pad 267 is an element connected to the first pad 265 and the first pad 265 and the second pad 267 may have a high capacitance. The vertical conductive pattern 268 may be implemented with a metal having a high resistance.

Figure 15:
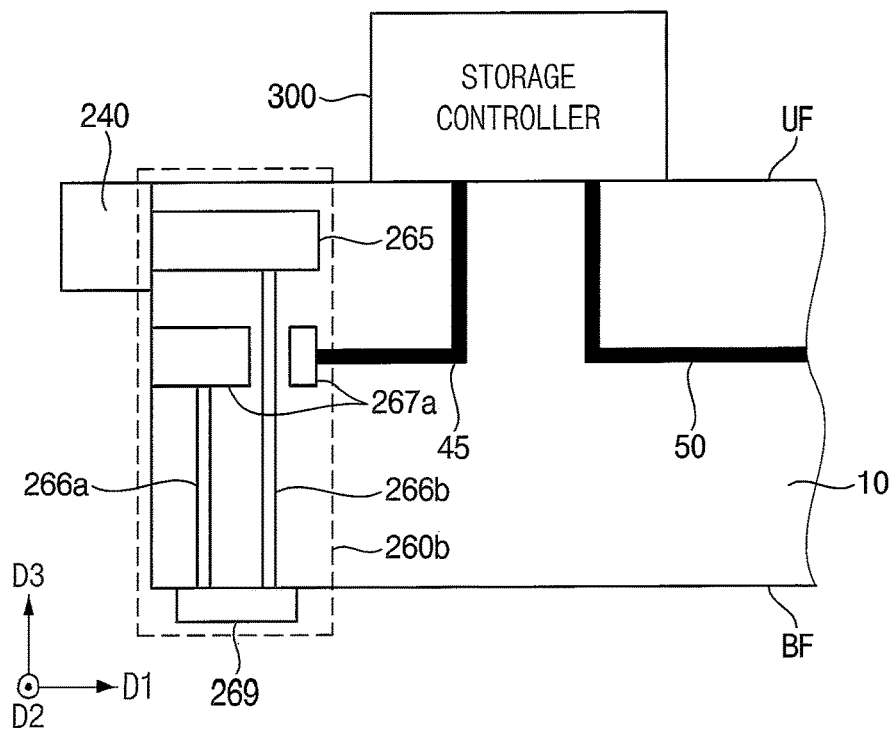
FIG. 15 illustrates another example in which the passive filter in FIG. 13 is provided in the PCB according to example embodiments.

FIG. 15 illustrates another example in which the passive filter in FIG. 13 is provided in the PCB according to example embodiments.

Referring to FIG. 15, a passive filter 260b may include a first pad 265, a second pad 267a and a resistive element 269. The first pad 265 may be connected to the connector 240 in the PCB 10. The second pad 267a may be spaced apart from the first pad 265 in a vertical direction D3 from an upper surface UF of the PCB 10 to a lower surface BF of the PCB 10. The resistive element 269 may be provided on the lower surface BF of the PCB 10.

The first pad 265 and the second pad 267a may be connected to the resistive element 269 through a first via 266a and a second via 266b in the vertical direction D3, respectively. The second via 266b may penetrate through at least a portion of the second pad 267a to be connected to the resistive element 269.

The first pad 265 and the second pad 267a may provide the filter capacitor Cf in FIG. 8 and the resistive element 269, the first via 266a and the second via 266b may provide the filter resistor Rf in FIG. 8. The second pad 267 may be connected to the storage controller 300 through the first conductive pattern 45.

The first pad 265 is an element directly connected to the connector 240, and the first pad 265 and the second pad 267a may have a high capacitance.

Figure 16:
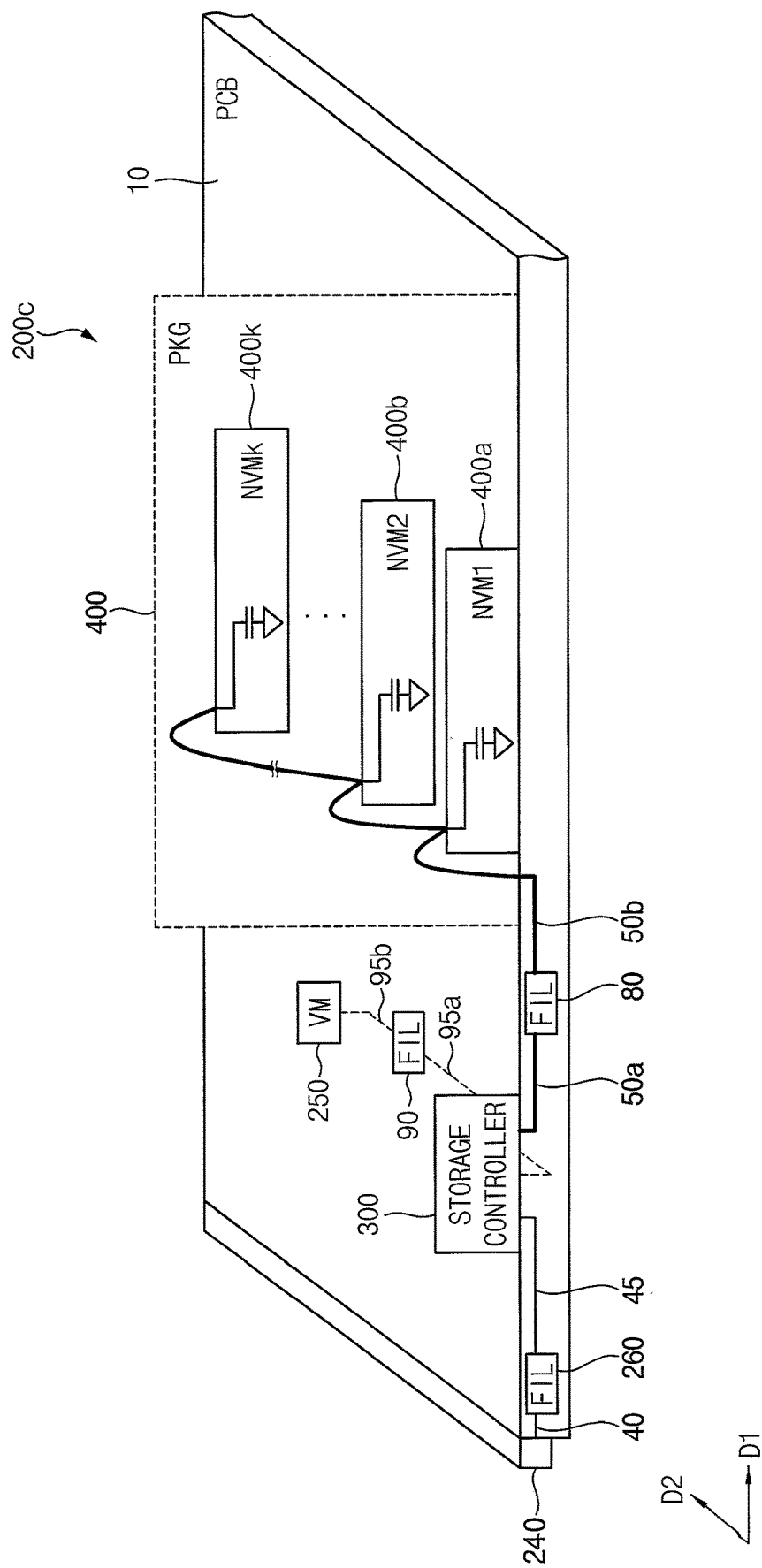
FIG. 16 is a block diagram illustrating another example of the storage device in FIG. 1 according to example embodiments.

FIG. 16 is a block diagram illustrating another example of the storage device in FIG. 1 according to example embodiments.

Referring to FIG. 16, a storage device 200c may include a storage controller 300, a package 400 including a plurality of nonvolatile memory devices 400a~400k and a volatile memory device 250 provided on a PCB 10.

The storage controller 300 and the nonvolatile memory devices 400a~400k may be electrically coupled to each other through a first transmission line 50a and a second transmission line 50b. The storage controller 300 may transmit a command signal and an address signal to the nonvolatile memory devices 400a~400k and may exchange data with the nonvolatile memory devices 400a~400k through the first transmission line 50a and the second transmission line 50b.

In addition, the storage device 200c may further include a connector 240 provided as a portion of the PCB 10 and at least one passive filter 260 connected between the connector 240 and the storage controller 300. The at least one passive filter 260 is provided in the PCB 10 and may be provided (or formed) by using at least a portion of the PCB 10. The passive filter 260 may be connected to the storage controller 300 through a first conductive pattern 45 and may be connected to the signal connector 241 in FIG. 1. 1 of the connector 240 through a second conductive pattern 40.

The storage device 200c may further include at least one passive filter (FIL) 80 provided in the PCB 10 and connected between the storage controller 300 and the nonvolatile memory devices 400a~400k.

The at least one passive filter 80 may be connected to the storage controller 300 through the first transmission line 50a and may be connected to the nonvolatile memory devices 400a~400k through the second transmission line 50b. The at least one passive filter 80 may perform equalization on signals exchanged between the storage controller 300 and the nonvolatile memory devices 400a~400k. The at least one passive filter 80 may increase signal integrity of signals exchanged between the storage controller 300 and the nonvolatile memory devices 400a~400k.

The storage device 200c may further include at least one passive filter (FIL) 90 provided in the PCB 10 and connected between the storage controller 300 and the volatile memory device (VM) 250.

The at least one passive filter 90 may be connected to the storage controller 300 through a first transmission line 95a and may be connected to the volatile memory device 250 through second transmission line 95b. The at least one passive filter 90 may perform equalization on signals exchanged between the storage controller 300 and the volatile memory device 250. The at least one passive filter 90 may increase signal integrity of signals exchanged between the storage controller 300 and the volatile memory device 250.

The at least one passive filter 260 may be referred to as at least one first passive filter, the at least one passive filter 80 may be referred to as at least one second passive filter and at least one passive filter 90 may be referred to as at least one third passive filter.

Each of the passive filters 80 and 90 may include a filter resistor and a filter capacitor connected in parallel in a manner similar to the passive filter 260. Each of the passive filters 80 and 90 may include a filter resistor and a filter capacitor connected in parallel as described with reference to FIG. 8.

Figure 17:
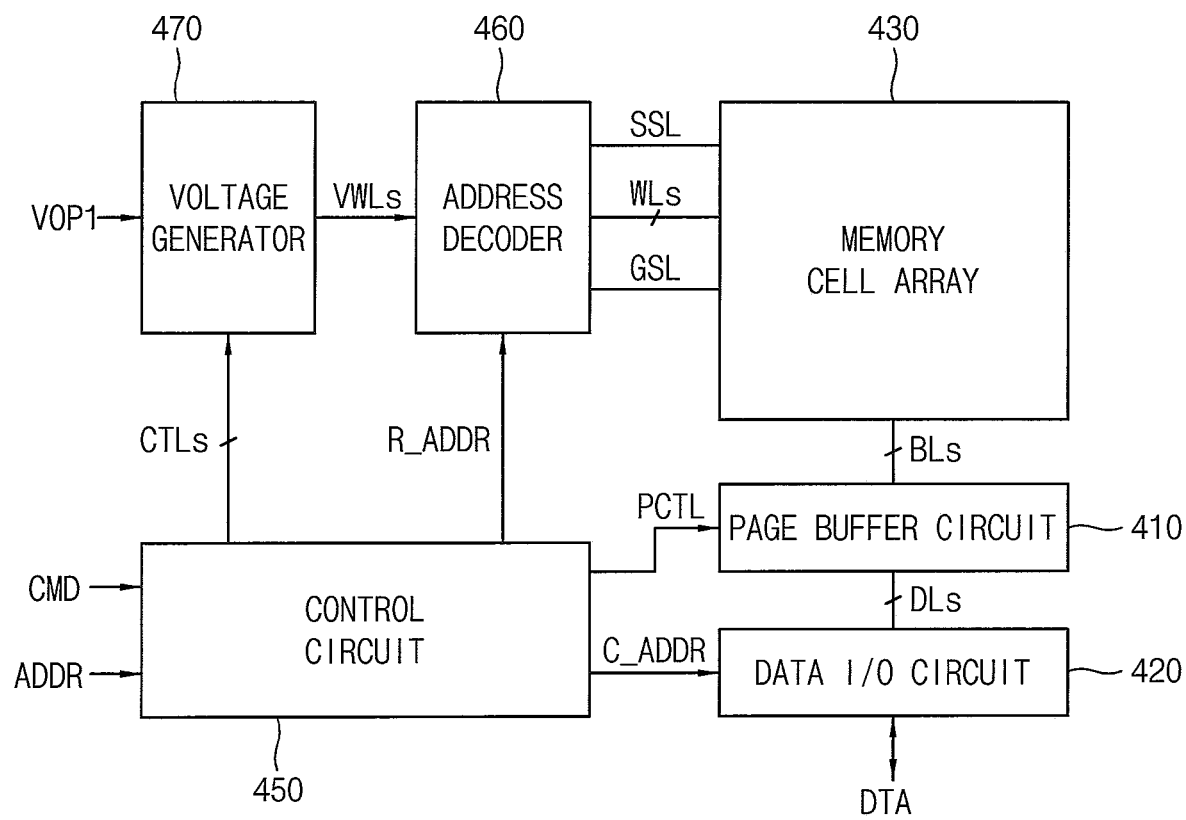
FIG. 17 is a block diagram illustrating one of the nonvolatile memory devices in the storage device in FIG. 1 according to example embodiments.

FIG. 17 is a block diagram illustrating one of the nonvolatile memory devices in the storage device in FIG. 1 according to example embodiments.

Referring to FIG. 17, the nonvolatile memory device 400a includes a memory cell array 430, an address decoder 460, a page buffer circuit 410, a data input/output circuit 420, a control circuit 450, and a voltage generator 470.

The memory cell array 430 is coupled to the address decoder 460 through a string selection line SSL, a plurality of word lines WLs, and a ground selection line GSL. In addition, the memory cell array 430 is coupled to the page buffer circuit 410 through a plurality of bit lines BLs. The memory cell array 430 includes a plurality of memory cells coupled to the plurality of word lines WLs and the plurality of bit lines BLs. The memory cell array 430 may include a plurality of memory cells coupled to the plurality of word lines WLs stacked in a vertical direction which is perpendicular to a substrate.

Figure 18:
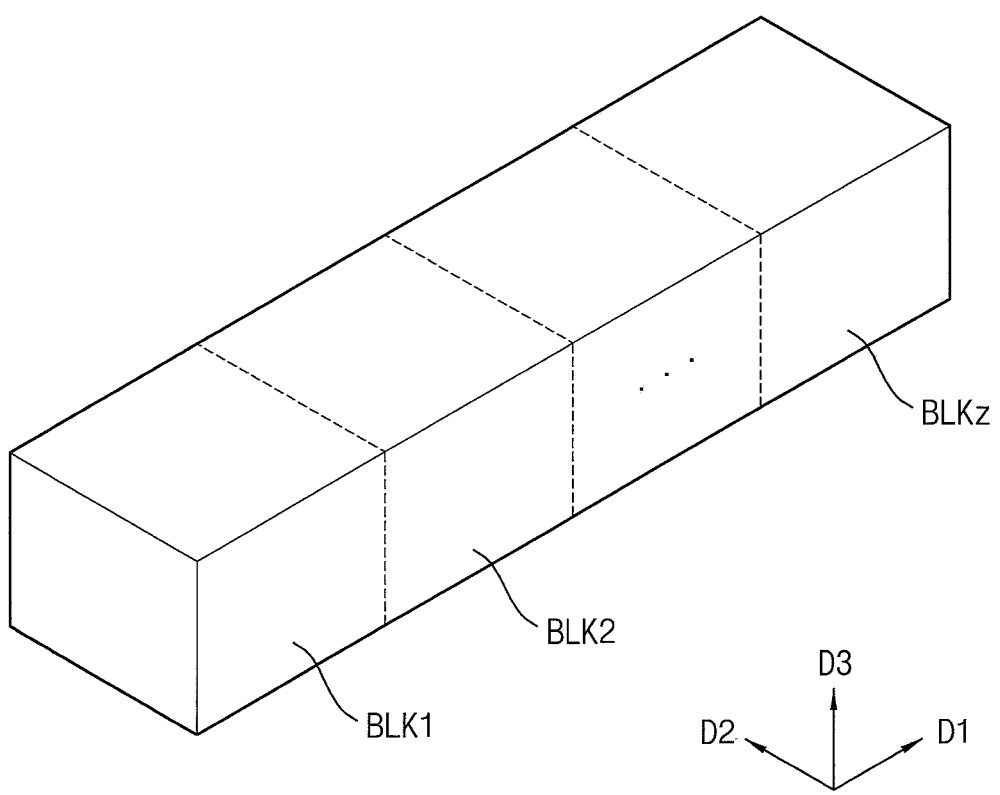
FIG. 18 illustrates a block diagram of the memory cell array in the nonvolatile memory device of FIG. 17 according to example embodiments.

FIG. 18 illustrates a block diagram of the memory cell array in the nonvolatile memory device of FIG. 17.

Referring to FIG. 18, the memory cell array 430 may include a plurality of memory blocks BLK1 to BLKz. The memory blocks BLK1 to BLKz extend along first through third directions D1, D2 and D3. In an example embodiment, the memory blocks BLK1 to BLKz are selected by the address decoder 460 in FIG. 17. For example, the address decoder 460 may select a memory block BLK corresponding to a block address from among the memory blocks BLK1 to BLKz.

Figure 19:
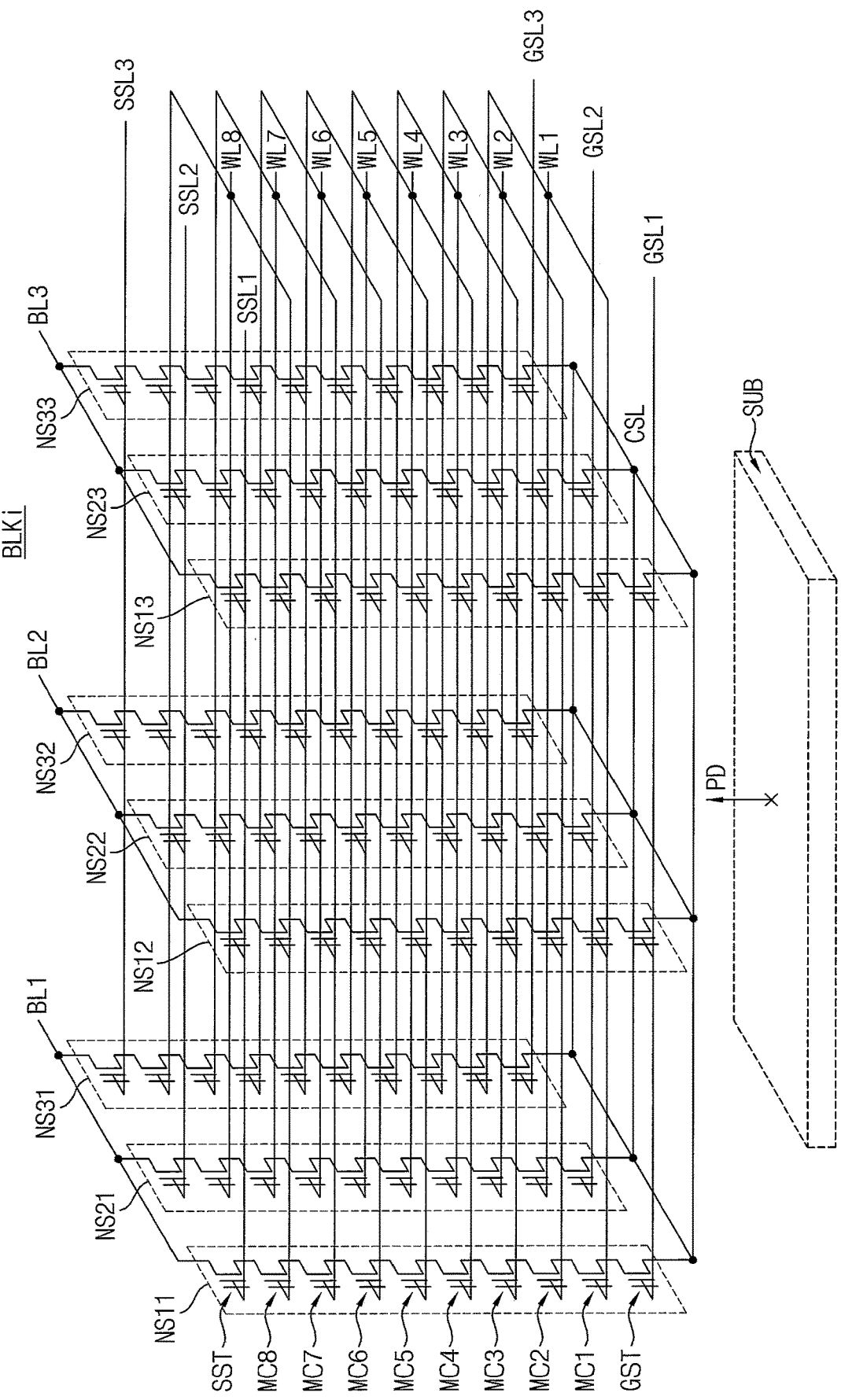
FIG. 19 illustrates a circuit diagram of one of the memory blocks of FIG. 18 according to example embodiments.

FIG. 19 illustrates a circuit diagram of one of the memory blocks of FIG. 18.

The memory block BLKi of FIG. 19 may be formed on a substrate SUB in a three-dimensional structure (or a vertical structure). For example, a plurality of memory cell strings included in the memory block BLKi may be formed in a direction PD perpendicular to the substrate SUB.

Referring to FIG. 19, the memory block BLKi may include memory cell strings NS11, NS12, NS13, NS21, NS22, NS23, NS31, NS32 and NS33 (which may hereinafter be referred to as memory cell strings NS11 to NS33) coupled between bit-lines BL1, BL2 and BL3 and a common source line CSL. Each of the memory cell strings NS11 to NS33 may include a string selection transistor SST, a plurality of memory cells MC1, MC2, MC3, MC4, MC5, MC6, MC7 and MC8 (which may hereinafter be referred to as memory cells MC1 to MC8), and a ground selection transistor GST. In FIG. 19, each of the memory cell strings NS11 to NS33 includes eight memory cells MC1 to MC8. However, example embodiments are not limited thereto. In some example embodiments, each of the memory cell strings NS11 to NS33 may include any number of memory cells.

The string selection transistor SST may be connected to corresponding string selection lines SSL1, SSL2 and SSL3. The plurality of memory cells MC1 to MC8 may be respectively connected to corresponding word-lines WL1, WL2, WL3, WL4, WL5, WL6, WL7 and WL8 (which may hereinafter be referred to as word-lines WL1 to WL8. The ground selection transistor GST may be connected to corresponding ground selection lines GSL1, GSL2 and GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 16, the memory block BLKi is coupled to eight word-lines WL1 to WL8 and three bit-lines BL1 to BL3. However, example embodiments are not limited thereto. In some example embodiments, the memory cell array 430 may be coupled to any number of word-lines and bit-lines.

Figure 20:
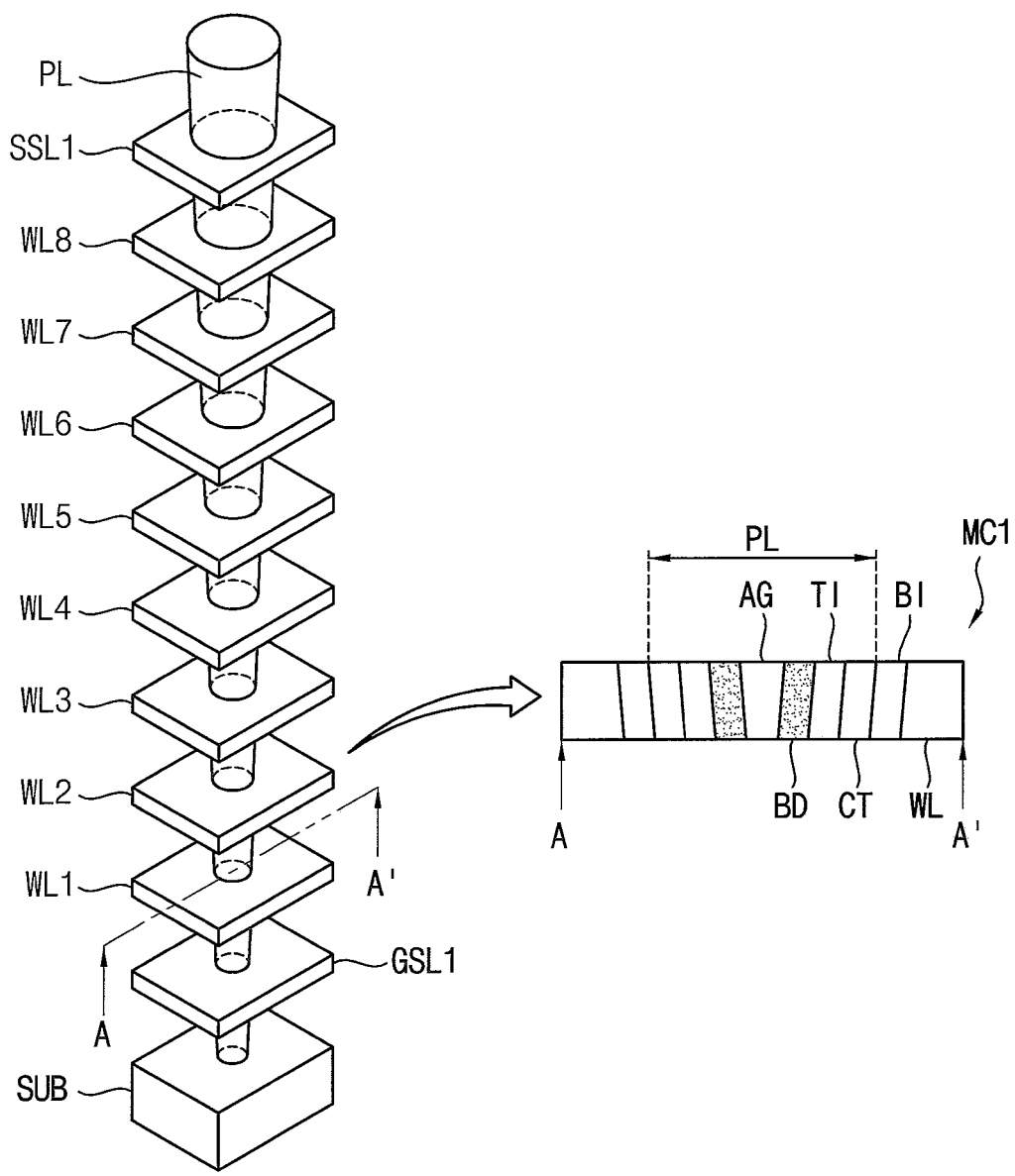
FIG. 20 illustrates an example of a structure of a cell string in the memory block of FIG. 19.

FIG. 20 illustrates an example of a structure of a cell string CS (e.g., memory cell string NS11) in the memory block of FIG. 19.

Referring to FIGS. 19 and 20, a pillar PL is provided on the substrate SUB such that the pillar PL extends in a direction perpendicular to the substrate SUB to make contact with the substrate SUB. Each of the ground selection lines GSL (e.g., ground selection line GSL1), the word lines WL1 to WL8, and the string selection lines SSL (e.g., string selection line SSL1) illustrated in FIG. 19 may be formed of a conductive material parallel with the substrate SUB, for example, a metallic material. The pillar PL may be in contact with the substrate SUB through the conductive materials forming the string selection lines SSL, the word lines WL1 to WL8, and the ground selection line GSL.

A sectional view taken along a line A-A' is also illustrated in FIG. 20. In an example embodiment, a sectional view of a first memory cell MC1 corresponding to a first word line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word line WL and the pillar PL. The body BD, the tunnel insulating layer TI, the charge trap layer CT, the blocking insulating layer BI, and the first word line WL may constitute a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

Referring back to FIG. 17, the control circuit 450 may receive the command signal CMD and the address signal ADDR from the storage controller 300 and control an erase operation, a program operation, and a read operation of the nonvolatile memory device 400a based on the command signal CMD and the address signal ADDR.

For example, the control circuit 450 may generate control signals CTLs, which are used for controlling the voltage generator 470, based on the command signal CMD, and generate a row address R_ADDR and a column address C_ADDR based on the address signal ADDR. The control circuit 450 may provide the row address R_ADDR to the address decoder 460 and provide the column address C_ADDR to the data input/output circuit 420.

In an example embodiment, the address decoder 460 is coupled to the memory cell array 430 through the string selection line SSL, the plurality of word lines WLs, and the ground selection line GSL.

In an example embodiment, the voltage generator 470 generates word line voltages VWLs using the first operation voltage VOP1, which are used for the operation of the nonvolatile memory device 400a, based on the control signals CTLs. The word line voltages VWLs are applied to the plurality of word lines WLs through the address decoder 460.

In an example embodiment, the page buffer circuit 410 is coupled to the memory cell array 430 through the plurality of bit lines BLs. The page buffer circuit 410 may include a plurality of page buffers. In some example embodiments, one page buffer may be connected to one bit line. In other example embodiments, one page buffer may be connected to two or more bit-lines. The page buffer circuit 410 may temporarily store data to be programmed in a selected page or data read out from the selected page. The page buffer circuit 410 is controlled in response to a control signal PCTL received from the control circuit 450.

In an example embodiment, the data input/output circuit 420 is coupled to the page buffer circuit 410 through data lines DLs. During the program operation, the data input/output circuit 420 may receive program data DTA from the storage controller 300 and provide the program data DTA to the page buffer circuit 410 based on the column address C_ADDR received from the control circuit 450. During the read operation, the data input/output circuit 420 may provide read data DTA, which is stored in the page buffer circuit 410, to the storage controller 300 based on the column address C_ADDR received from the control circuit 450.

Figure 21:
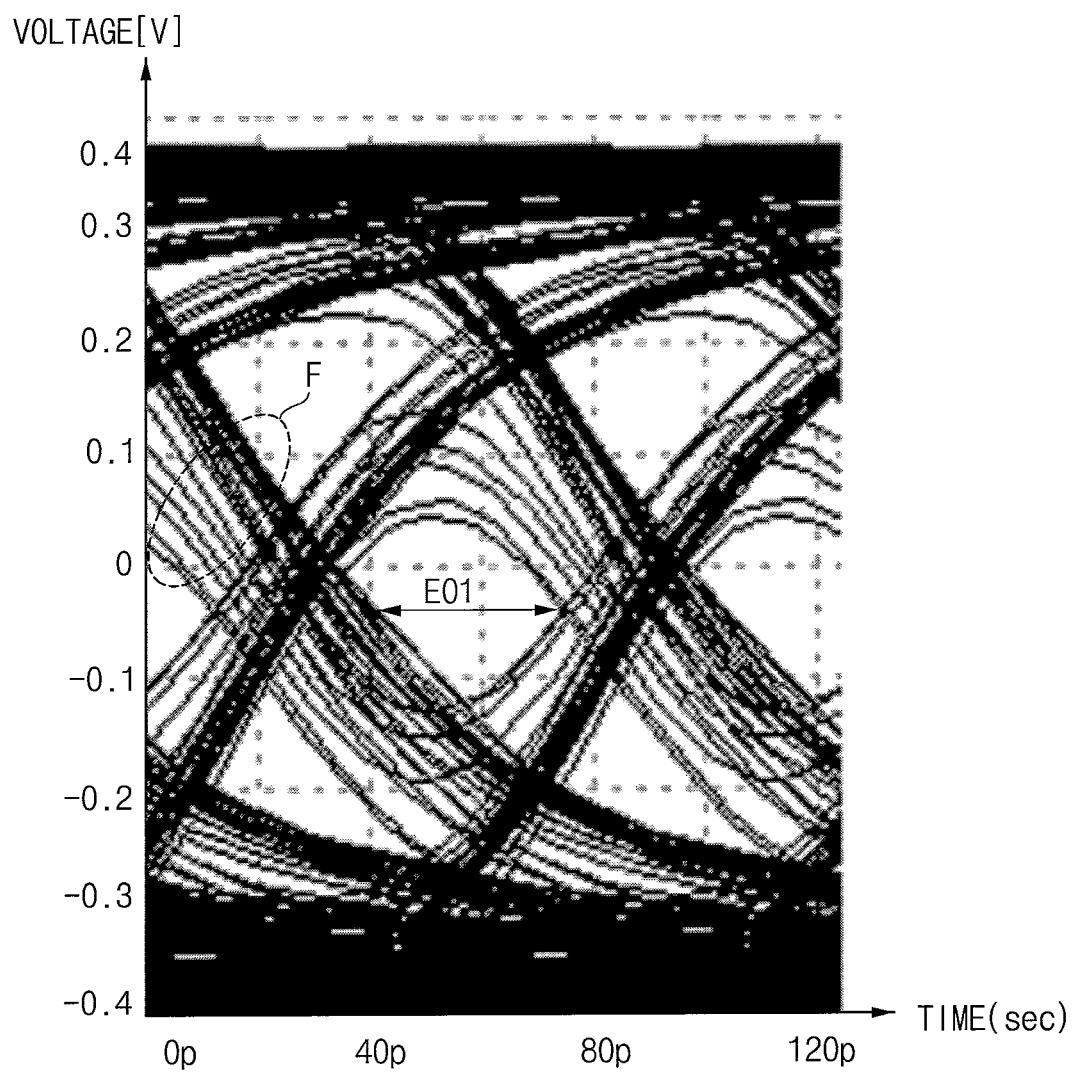
FIGS. 21 and 22 are diagrams for explaining operation of the storage device according to example embodiments.
Figure 22:
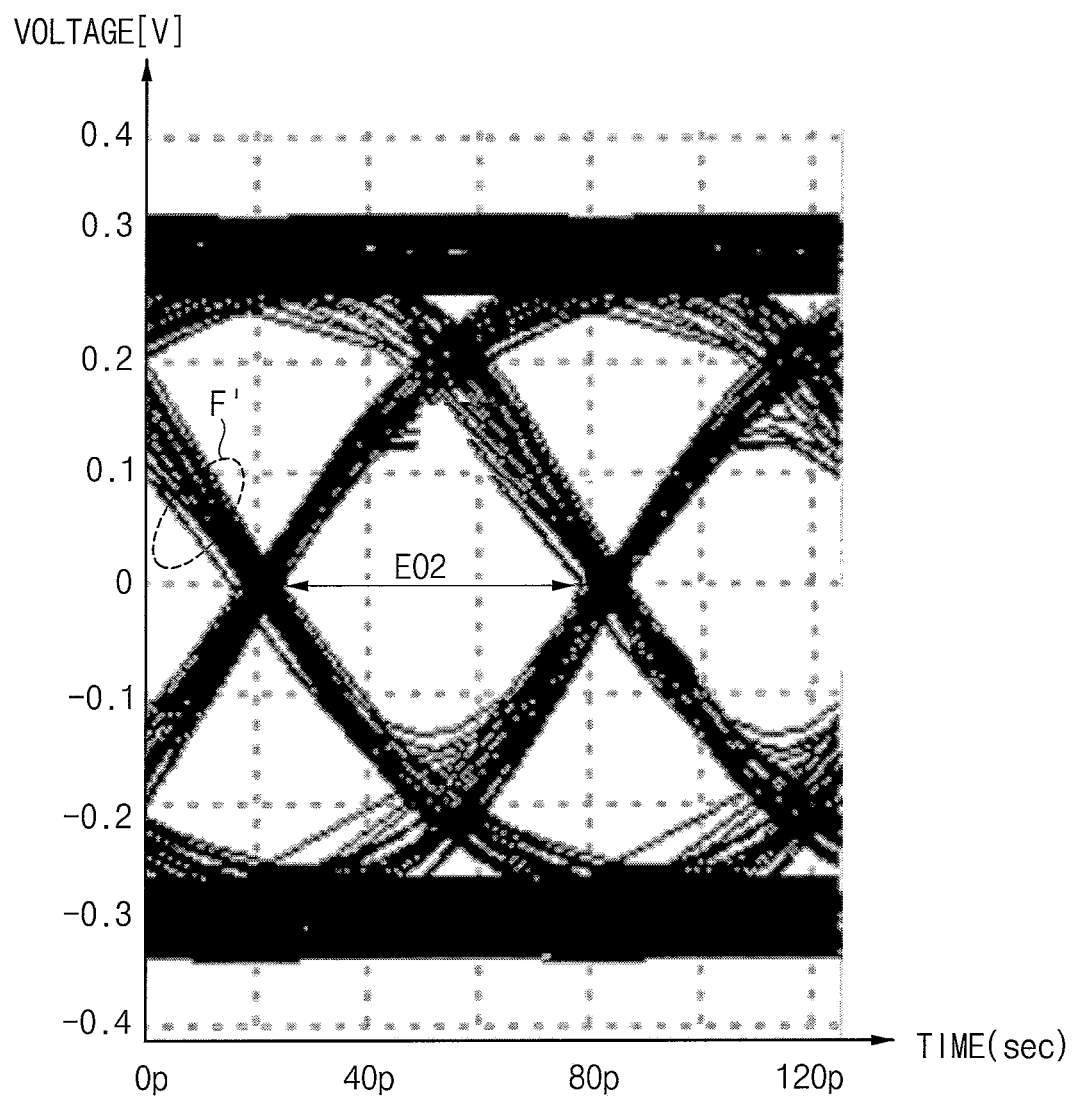

FIGS. 21 and 22 are diagrams for explaining operation of the storage device according to example embodiments.

FIG. 21 is an eye diagram of a data signal output from the connector 240 to the host 100 when the storage device 200 in FIG. 1 does not include the at least one passive filter 260 and 280. FIG. 22 is an eye diagram of a data signal output from the connector 240 to the host 100 when the storage device 200 in FIG. 1 includes the at least one passive filter 260 and 280.

In FIGS. 21 and 22, a horizontal axis denotes time and a vertical axis denotes a voltage level of the data signal.

Referring to FIGS. 1, 21 and 22, it is noted that an eye open ratio EO2 in which the storage device 200 in FIG. 1 includes the at least one passive filter 260 and 280 is greater than an eye open ratio EO1 in which the storage device 200 in FIG. 1 does not include the at least one passive filter 260 and 280. In addition, it is noted that the data signal is dispersed in FIG. 21 as a portion F indicates and the data signal is not dispersed in FIG. 22 as a portion F' indicates. Therefore, when the storage device 200 includes the at least one passive filter 260 and 280, the signal integrity output from the storage device 200 may be increased.

According to example embodiments, at least one passive filter is provided in the PCB between the connector and the storage controller and the least one passive filter equalizes the signals provided from the storage controller or provided to the storage controller. Therefore, signal integrity of high-frequency signal output from the storage controller to the host and thus, power consumption of the storage device may be reduced.

Figure 23:
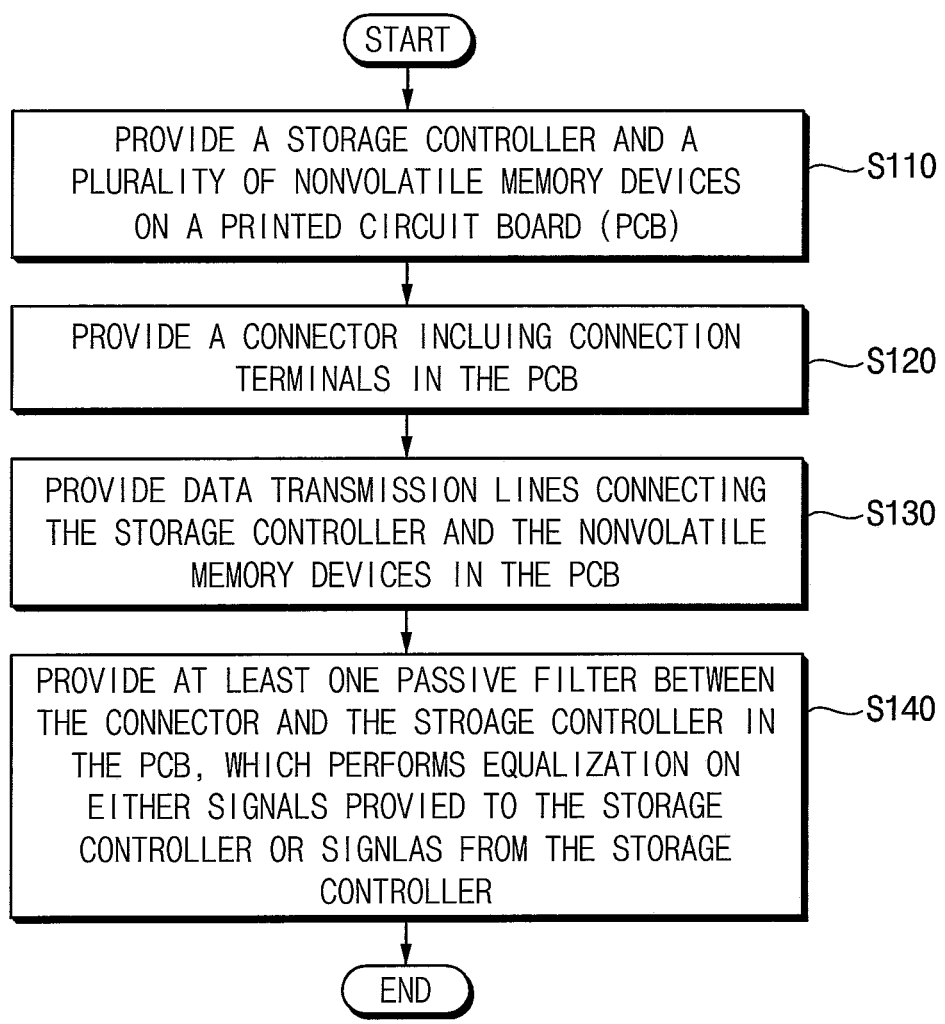
FIG. 23 is a flow chart illustrating a method of operating a storage device according to example embodiments.

FIG. 23 is a flow chart illustrating a method of operating a storage device according to example embodiments.

Referring to FIGS. 1 through 23, in a method of operating the storage device 200, a storage controller 300 and a plurality of nonvolatile memory devices 400a~400k are provided on a PCB 10 (operation S110). The plurality of nonvolatile memory devices 400a~400k may be distributed on the PCB 10 or the plurality of nonvolatile memory devices 400a~400k may be provided on the PCB in a form of multi-stacked chip package.

A connector 240 including a plurality of connection terminals are provided in the PCB 10 (operation S120). The storage controller 300 may communicate with an external host 100 through the connector 240.

A plurality of transmission lines 50 electrically connecting the storage controller 300 and the nonvolatile memory devices 400a~400k are provided in the PCB (operation S130).

At least one passive filter 260 and 280 are provided in the PCB 10 between the storage controller 300 and the connector 240 (operation S140). The at least one passive filter 260 and 280 may perform equalization on either signals provided to the storage controller 300 or signals provided from the storage controller 300.

The at least one passive filter 260 and 280 may be provided by connecting a filter resistor Rf and a filter capacitor Cf in the PCB 10 in parallel between a first node N21 coupled to the storage controller 300 and a second node N22 coupled to the connector 240.

Therefore, the at least one passive filter 260 and 280 may increase signal integrity of signals exchanged between the storage controller 300 and the host 100.

Figure 24:
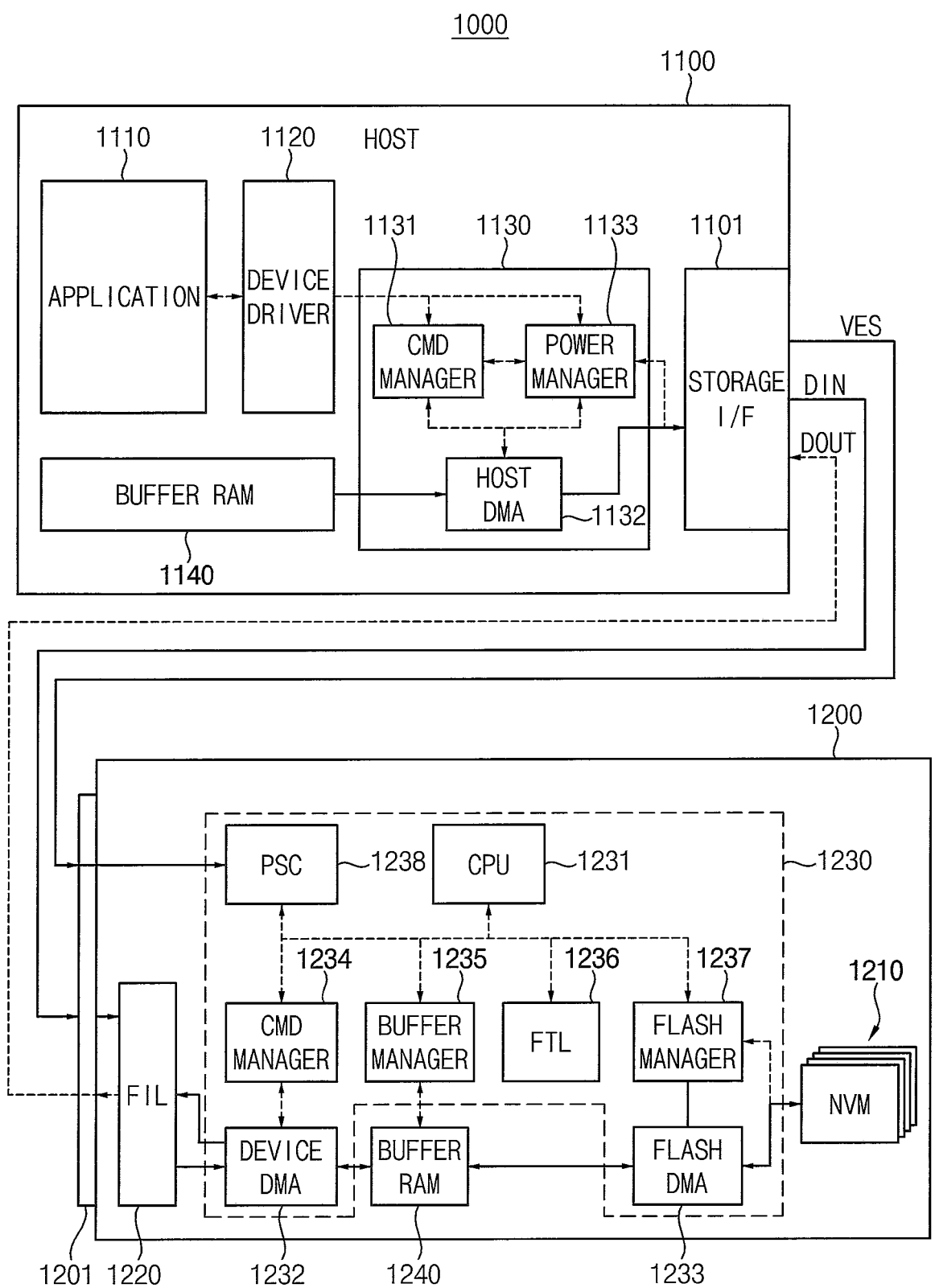
FIG. 24 is a block diagram illustrating a storage system according to example embodiments.

FIG. 24 is a block diagram illustrating a storage system according to example embodiments.

Referring to FIG. 24, a storage system 1000 may include a host 1100 and a storage device 1200. The storage device 1200 may be connected to the host 1100 through a connector 1201 including a plurality of connection terminals and may communicate with the host 1100. The connector 1201 may include a signal connector and a power connector as described with reference to FIG. 1.

The host 1100 includes an application 1110, a device driver 1120, a host controller 1130, and buffer RAM 1140. The host controller 1130 includes a command manager 1131, a host direct memory access (DMA) 1132, and a power manager 1133.

In operation, a system level command (e.g., a write command) is generated by the application 1110 and device driver 1120 of the host 1100 and is then provided to the command manager 1131 of the host controller 1130. The command manager 1131 may be used to generate a corresponding storage device command (i.e., a corresponding command or set of commands consistent with a protocol being implemented by the storage system 1000) that is provided to the storage device 1200 using the device driver 1120. The command generated by the command manager 1131 may also be provided to the host DMA 1132 which sends the command to the storage device 1200 via the storage interface 1101.

The storage device 1200 includes flash memory devices 1210, a device controller 1230, and a buffer random access memory (RAM) 1240. The device controller 1230 may include a Central Processing Unit (CPU) 1231, a device DMA 1232, a flash DMA 1233, a command manager 1234, a buffer manager 1235, a flash translation layer (FTL) 1236, a flash manager 1237, and a power supply circuit 1238. The power supply circuit 1238 may generate operating voltages based on a power supply voltage VES provided by the host 1100.

The flash memory devices 1210, the device controller 1230, and the buffer RAM 1240 may be provided on the PCB. The storage device 1200 may further include at least one passive filter 1220 connected between the device controller 1230 and the connector 1201. The least one passive filter 1220 may be provided in the PCB.

The least one passive filter 1220 may perform an equalization on signals exchanged between the device controller 1230 and the connector 1201 and may increase signal integrity of the signals. The least one passive filter 1220 may include a filter resistor and a filter capacitor connected in parallel as described with reference to FIG. 8.

A command transferred from the host 1100 to storage device 1200 may be provided to the device DMA 1232 via the connector 1201.

The device DMA 1232 may then communicate the received command to the command manager 1234. The command manager 1234 may be used to allocate memory space in the buffer RAM 1240 in order to receive corresponding write data via the buffer manager 1235. Once the storage device 1200 is ready to receive the write data, the command manager 1234 may communicate a transmission "ready" signal to the host 1100.

Upon receiving the transmission ready signal, the host 1100 will communicate the write data to the storage device 1200. The write data may be sent to the storage device 1200 using the host DMA 1132 and storage interface 1101. The storage device 1200 may then store the received write data in the buffer RAM 1240 using the device DMA 1232 and buffer manager 1235. The write data stored in the buffer RAM 1240 may then be provided to the flash manager 1237 via the flash DMA 1233. The flash manager 1237 may be used to program the write data according to addresses for the flash memory 1210 derived from an address mapping table by the flash translation layer 1236.

Once the transfer and programming of the write data is complete, the storage device 1200 may send a response to the host 1100 informing the host 1100 that the write command has been successfully executed. Based on the received response signal, the host 1100 indicates to the device driver 1120 and application 1110 that the command is complete, and will thereafter terminate execution of the operation corresponding to the command.

As described above, the host 1100 and storage device 1200 may exchange data, corresponding commands and/or control signal(s) (e.g., the ready and response signals) via data lines of the data segment (e.g., data lines DIN and DOUT).

The storage device 1200 includes the passive filter 1220 connected between the device controller 1230 and the connector 1201 in the PCB and may increase signal integrity of the signals output from the device controller 1230 to the host 1100.

A storage device or a storage system according to example embodiments may be packaged using various package types or package configurations.

The present disclosure may be applied to various electronic devices including storage devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A storage device, comprising:
a plurality of nonvolatile memory devices provided on a printed circuit board (PCB);
a connector provided in the PCB, the connector comprising a plurality of connection terminals, the plurality of connection terminals comprising a first connection terminal and a second connection terminal;
a storage controller provided on the PCB, the storage controller being configured to communicate with an external host through the plurality of connection terminals and control the plurality of nonvolatile memory devices; and
at least one first passive filter provided in the PCB and connected between the connector and the storage controller, the at least one first passive filter being configured to perform an equalization on any one or any combination of a signal provided to the storage controller and a signal provided from the storage controller,
wherein the at least one first passive filter comprises:
a first passive filter comprising a first filter resistor and a first filter capacitor connected in parallel between the storage controller and the first connection terminal; and
a second passive filter comprising a second filter resistor and a second filter capacitor connected in parallel between the storage controller and the second connection terminal.

2. The storage device of claim 1, wherein:
the first filter resistor and the first filter capacitor are connected in parallel between a first node and a second node;
the first filter resistor and the first filter capacitor are provided in the PCB; and
the first node is connected to the storage controller and the second node is connected to the connector.

3. The storage device of claim 2, wherein any one or any combination of the first filter resistor and the first filter capacitor is provided by using at least a portion of the PCB.

4. The storage device of claim 2, wherein:
the first filter capacitor comprises a first pad and a second pad, the first pad being connected to the connector in the PCB, and the second pad being spaced apart from the first pad in a vertical direction from an upper surface of the PCB to a lower surface of the PCB; and
the first filter resistor comprises a vertical conductive pattern that connects the first pad and the second pad in the vertical direction.

5. The storage device of claim 4, wherein the second pad is connected to the storage controller through a conductive pattern.

6. The storage device of claim 2, wherein:
the first filter capacitor comprises a first pad and a second pad, the first pad being connected to the connector in the PCB, the second pad being spaced apart from the first pad in a vertical direction from an upper surface of the PCB to a lower surface of the PCB; and
the first filter resistor comprises a resistive element connected to the first pad and the second pad through vias formed in the vertical direction and the resistive element is provided in the lower surface of the PCB.

7. The storage device of claim 6, wherein the second pad is connected to the storage controller through a conductive pattern.

8. The storage device of claim 6, wherein:
the vias comprise a first via and a second via, the first via connecting the first pad and the resistive element, and the second via connecting the second pad and the resistive element;
the first via penetrates through the second pad.

9. The storage device of claim 2, wherein:
the storage controller comprises a host interface configured to interface with the external host;
the host interface comprises a transmitter configured to transmit a differential signal based on a request from the external host;

the first passive filter is connected between a first pad coupled to the transmitter and the first connection terminal of the connector; and the second passive filter is connected between a second pad coupled to the transmitter and the second connection terminal.

10. The storage device of claim 9, wherein:

the first connection terminal is connected to a resistor and a capacitor in a receiver of a storage interface of the external host through a host channel; and the first filter resistor, the first filter capacitor, the resistor and the capacitor in a receiver constitute a continuous time linear equalizer.

11. The storage device of claim 1, further comprising:

a volatile memory device, connected to the storage controller, configured to operate as a buffer; and a third passive filter provided in the PCB and connected between the storage controller and the volatile memory device.

12. The storage device of claim 11, wherein any one or any combination of the second passive filter and the third passive filter is provided by using at least a portion of the PCB.

13. The storage device of claim 1, wherein the plurality of nonvolatile memory devices are provided on the PCB as a multi-stack chip.

14. The storage device of claim 13, wherein each of the plurality of nonvolatile memory devices comprises:

a memory cell array comprising a plurality of memory blocks, each of which comprises a plurality of nonvolatile memory cells coupled to word-lines and bit-lines;

a data input/output (I/O) circuit configured to receive data to be programmed in the memory cell array from the storage controller through a data transmission line and provide data read from the memory cell array to the storage controller through the data transmission line; and a control circuit configured to control the data I/O circuit.

15. The storage device of claim 14, wherein any one or any combination of the plurality of memory blocks comprises NAND strings, each of which comprises a plurality of nonvolatile memory cells sequentially stacked on a substrate.

16. A method of operating a storage device, the method of comprising:

providing a storage controller and a plurality of nonvolatile memory devices on a printed circuit board (PCB);

providing a connector with a plurality of connection terminals in the PCB, the plurality of connection terminals comprising a first connection terminal and a second connection terminal;

providing data transmission lines electrically connecting the storage controller and the plurality of nonvolatile memory devices in the PCB;

providing at least one passive filter between the connector and the storage controller in the PCB;

performing an equalization, using the at least one passive filter, on any one or any combination of a signal provided to the storage controller and a signal provided from the storage controller; and communicating, using the storage controller, with an external host through the connector, wherein the providing the at least one passive filter comprises:

providing a first passive filter including a first filter resistor and a first filter capacitor connected in parallel between the storage controller and the first connection terminal; and providing a second passive filter including a second filter resistor and a second filter capacitor connected in parallel between the storage controller and the second connection terminal.

17. The method of claim 16, wherein the providing the at least one passive filter comprises connecting the first filter resistor and the first filter capacitor in parallel between a first node and a second node, and wherein the first filter resistor and the first filter capacitor are provided in the PCB, the first node is connected to the storage controller and the second node is connected to the first connection terminal.

18. The method of claim 17, wherein any one or any combination of the first filter resistor and the first filter capacitor is provided by using at least a portion of the PCB.

19. A storage device, comprising:

a printed circuit board (PCB);

a plurality of nonvolatile memory devices provided on the PCB;

a connector provided in the PCB, the connector comprising a plurality of connection terminals;

a storage controller provided on the PCB, the storage controller being configured to communicate with an external host through the plurality of connection terminals and control the plurality of nonvolatile memory devices; and at least one passive filter provided in the PCB and connected between the connector and the storage controller, the at least one passive filter being configured to perform an equalization on any one or any combination of a signal provided to the storage controller and a signal provided from the storage controller, wherein:

the at least one passive filter comprises a first filter resistor and a first filter capacitor connected in parallel between a first node and a second node, and a second filter resistor and a second filter capacitor connected in parallel between a third node and a fourth node;

the first filter resistor and the first filter capacitor are provided in the PCB; and the first node and the third node are coupled to the storage controller, and the second node and the fourth node are coupled to the connector.

\* \* \* \* \*